United States Patent
Yutani

(10) Patent No.: US 12,501,652 B2
(45) Date of Patent: Dec. 16, 2025

(54) SEMICONDUCTOR DEVICE

(71) Applicant: ROHM CO., LTD., Kyoto (JP)

(72) Inventor: Masatsugu Yutani, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 374 days.

(21) Appl. No.: 18/076,400

(22) Filed: Dec. 7, 2022

(65) Prior Publication Data

US 2023/0215944 A1 Jul. 6, 2023

(30) Foreign Application Priority Data

Jan. 5, 2022 (JP) .................. 2022-000513

(51) Int. Cl.
*H10D 30/66* (2025.01)
*H10D 62/10* (2025.01)
*H10D 62/17* (2025.01)

(52) U.S. Cl.
CPC ......... *H10D 30/668* (2025.01); *H10D 62/102* (2025.01); *H10D 62/393* (2025.01)

(58) Field of Classification Search
CPC ... H10D 30/668; H10D 62/102; H10D 62/393
USPC ........................................................ 257/153
See application file for complete search history.

(56) References Cited

U.S. PATENT DOCUMENTS

| | | | | |
|---|---|---|---|---|
| 2011/0233667 A1* | 9/2011 | Tai | ..................... | H10D 30/0297 257/334 |
| 2012/0112268 A1* | 5/2012 | Tai | ...................... | H10D 30/665 438/270 |
| 2014/0183620 A1* | 7/2014 | Takaya | ................. | H10D 64/517 257/77 |
| 2014/0239388 A1* | 8/2014 | Lee | ...................... | H10D 84/146 257/334 |

FOREIGN PATENT DOCUMENTS

JP 2006032420 A 2/2006
JP 2020-194881 A 12/2020

OTHER PUBLICATIONS

Office Action issued Oct. 7, 2025 in corresponding Japanese patent application No. JP2022-000513 (8 pages; with English translation).

* cited by examiner

*Primary Examiner* — Igwe U Anya
(74) *Attorney, Agent, or Firm* — XSENSUS LLP

(57) ABSTRACT

A semiconductor device includes: a semiconductor layer; a gate trench formed in the semiconductor layer; an insulating layer formed on the semiconductor layer; a gate electrode buried in the gate trench via the insulating layer; a gate wiring formed on the insulating layer and electrically connected to the gate electrode; and a protection trench formed in the semiconductor layer, wherein the semiconductor layer includes an outer peripheral region including outer edges of the semiconductor layer in a plan view and an inner region surrounded by the outer peripheral region, wherein the gate trench includes an outer peripheral gate trench portion arranged in the outer peripheral region and surrounded by the protection trench in a plan view, and wherein the outer peripheral gate trench portion and the protection trench are formed in a closed annular shape along the outer edges of the semiconductor layer in the outer peripheral region.

16 Claims, 14 Drawing Sheets

SEMICONDUCTOR DEVICE

CROSS-REFERENCE TO RELATED APPLICATION

This application is based upon and claims the benefit of priority from Japanese Patent Application No. 2022-000513, filed on Jan. 5, 2022, the entire contents of which are incorporated herein by reference.

TECHNICAL FIELD

The present disclosure relates to a semiconductor device.

BACKGROUND

In the related art, there is disclosed a semiconductor device having a trench gate-type MOSFET (Metal-Oxide-Semiconductor Field-Effect-Transistor) as a basic structure. The semiconductor device includes an active region set in a region covered with a source electrode, a gate trench formed in the active region, and a polysilicon gate buried in the gate trench.

In the trench gate type MOSFET, a relatively large drain-source leakage current $I_{DSS}$ may occur due to local electric field concentration.

SUMMARY

According to one embodiment of the present disclosure, a semiconductor device includes: a semiconductor layer; a gate trench formed in the semiconductor layer; an insulating layer formed on the semiconductor layer; a gate electrode buried in the gate trench via the insulating layer; a gate wiring formed on the insulating layer and electrically connected to the gate electrode; and a protection trench formed in the semiconductor layer, wherein the semiconductor layer includes an outer peripheral region including outer edges of the semiconductor layer in a plan view and an inner region surrounded by the outer peripheral region, wherein the gate trench includes an outer peripheral gate trench portion arranged in the outer peripheral region and surrounded by the protection trench in a plan view, and wherein the outer peripheral gate trench portion and the protection trench are formed in a closed annular shape along the outer edges of the semiconductor layer in the outer peripheral region.

DETAILED DESCRIPTION

Figure 1:
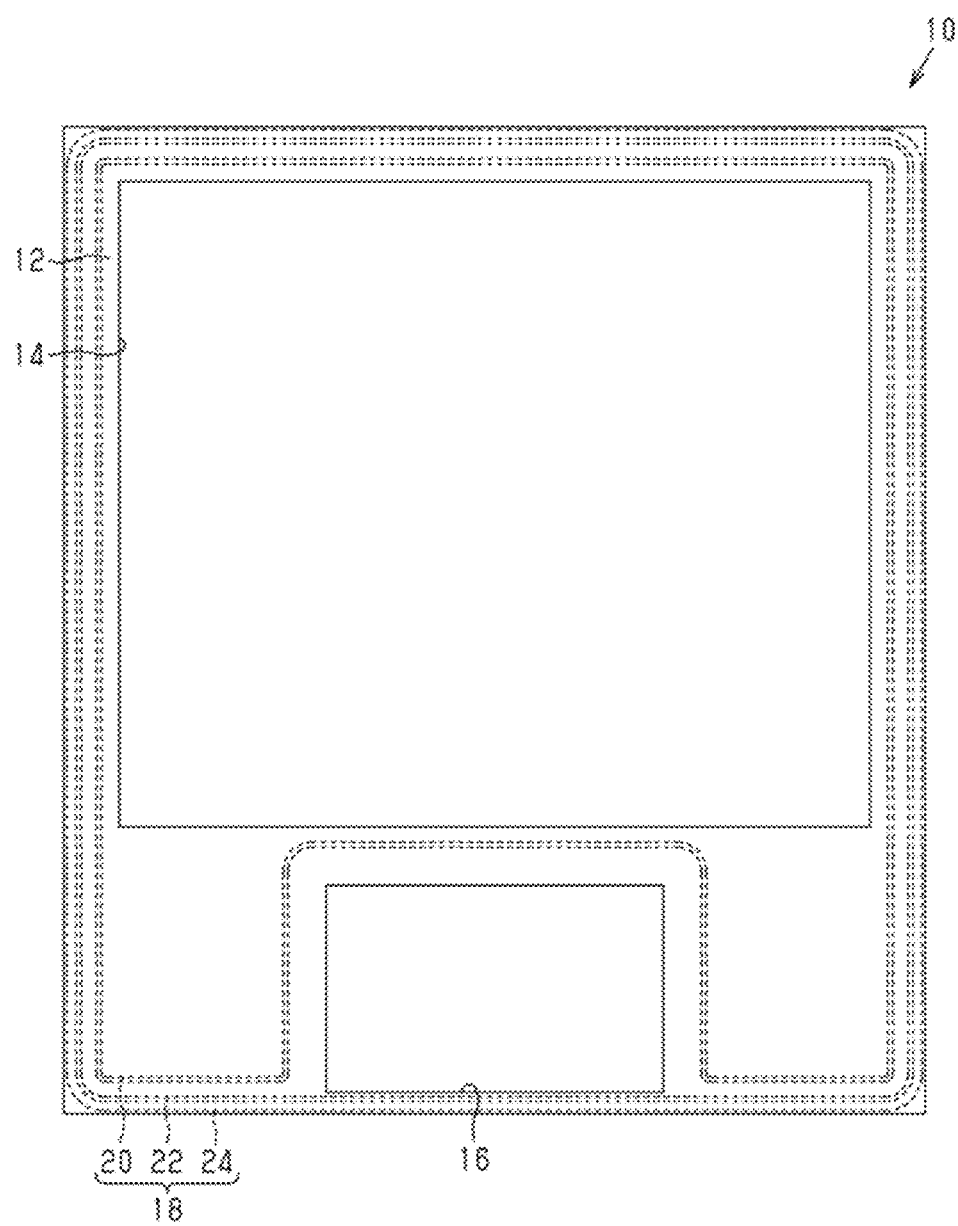
FIG. 1 is a schematic plan view of an exemplary semiconductor device according to an embodiment.

Some embodiments of a semiconductor device of the present disclosure will now be described with reference to the accompanying drawings. It should be noted that, for simplicity and clarity of explanation, components shown in the drawings are not necessarily drawn to scale. In order to facilitate understanding, hatching lines may be omitted in cross-sectional views. The accompanying drawings merely illustrate embodiments of the disclosure and should not be considered as limiting the present disclosure.

The following detailed description includes devices, systems, and methods embodying exemplary embodiments of the present disclosure. This detailed description is for illustrative purposes only and is not intended to limit the embodiments of the present disclosure or the applications and uses of such embodiments.

[Planar Layout of Semiconductor Device]

Figure 2:
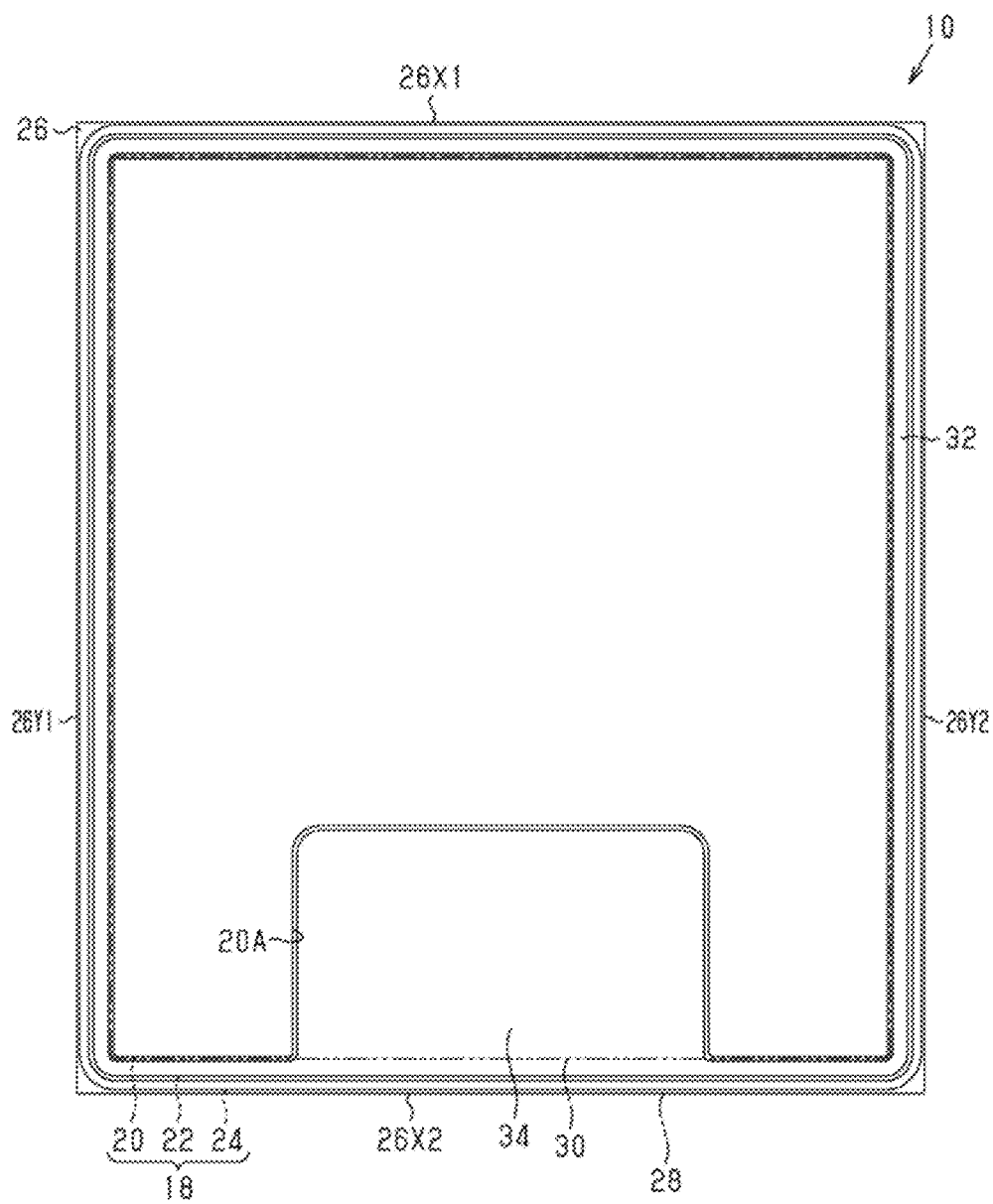
FIG. 2 is a schematic plan view for explaining a metal layer of the semiconductor device shown in FIG. 1.
Figure 3:
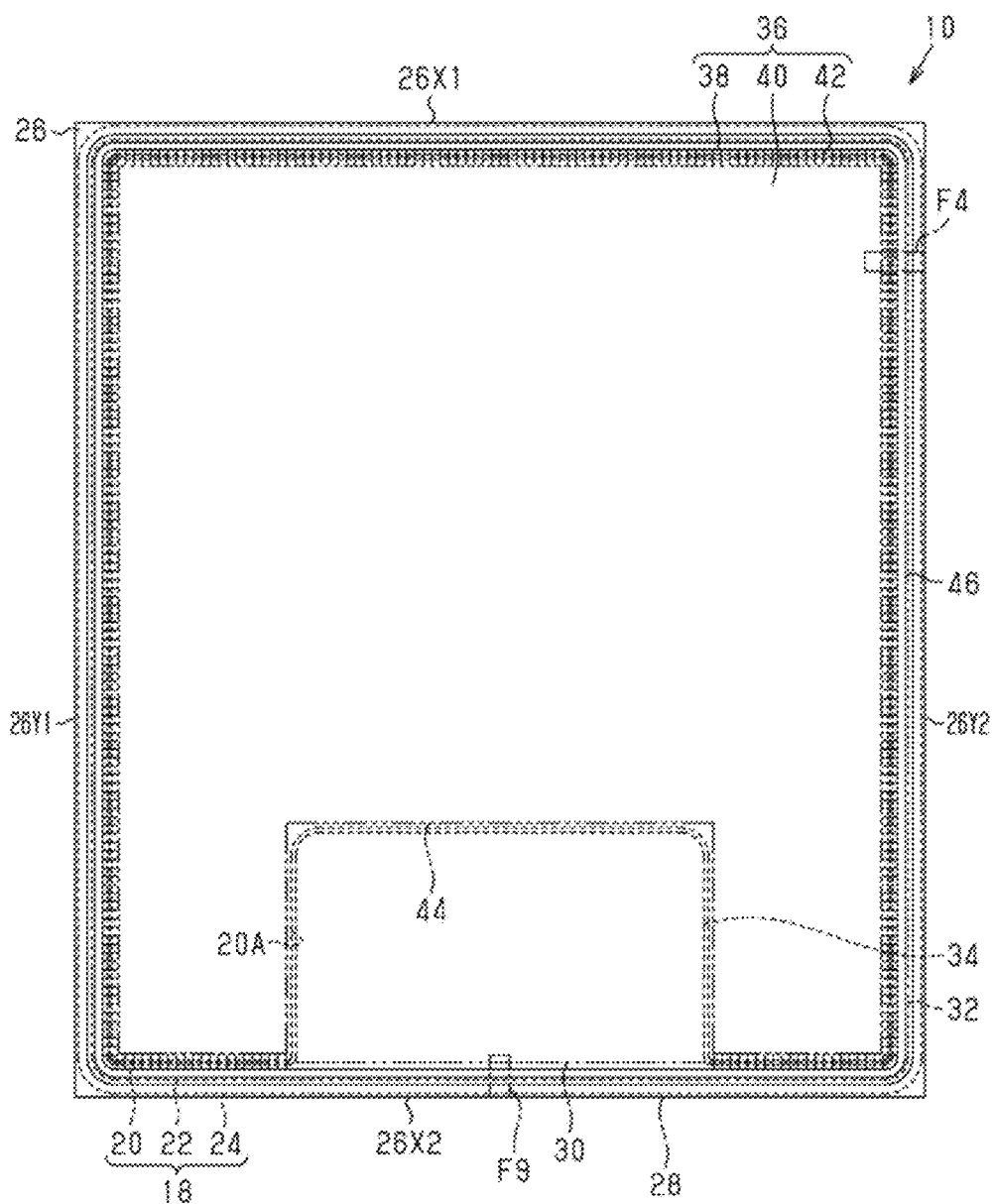
FIG. 3 is a schematic plan view for explaining a configuration formed in a semiconductor layer of the semiconductor device shown in FIG. 1.

FIGS. 1 to 3 are schematic plan views of a semiconductor device 10 according to one embodiment of the present disclosure. FIGS. 2 and 3 transparently show some elements of the semiconductor device 10 of FIG. 1. More specifically, FIG. 2 is a schematic plan view of the semiconductor device 10 with a passivation layer 12 removed from FIG. 1. FIG. 3 is a plan view of the semiconductor device 10 with a metal layer 18 (a source wiring 20, a gate wiring 22, and an outer peripheral electrode 24) removed from FIG. 2. It should be noted that the metal layer 18 is indicated by a broken line in FIG. 3 for ease of understanding.

The term "plan view" used in the present disclosure refers to viewing the semiconductor device 10 in a Z direction of mutually orthogonal XYZ axes shown in FIG. 1. Unless explicitly stated otherwise, the "plan view" refers to viewing the semiconductor device 10 from above along the Z axis.

As shown in FIG. 1, the semiconductor device 10 may be rectangular in a plan view. In one example, the semiconductor device 10 may have a rectangular parallelepiped shape. The semiconductor device 10 may include a passivation layer 12. The passivation layer 12 may be made of any material capable of protecting its underlying structure. In one example, the passivation layer 12 may be formed of a silicon nitride (SiN) film. The passivation layer 12 may include pad openings 14 and 16.

The semiconductor device 10 may further include a metal layer 18. The passivation layer 12 at least partially covers the metal layer 18. The metal layer 18 may be made of at least one of titanium (Ti), nickel (Ni), gold (Au), silver (Ag), copper (Cu), aluminum (Al), a Cu alloy, and an Al alloy. In one example, the metal layer 18 may be made of an AlCu alloy.

The metal layer 18 may include the source wiring 20, the gate wiring 22, and the outer peripheral electrode 24. The source wiring 20, the gate wiring 22, and the outer peripheral electrode 24 are spaced apart from one another. The gate wiring 22 is spaced apart from the source wiring 20 and surrounds the source wiring 20. The outer peripheral electrode 24 is spaced apart from the gate wiring 22 and surrounds the gate wiring 22. Further details of the source wiring 20, the gate wiring 22, and the outer peripheral electrode 24 will be described later with reference to FIG. 2.

The pad opening 14 may at least partially expose the source wiring 20. Further, the pad opening 16 may at least partially expose the gate wiring 22. The pad openings 14 and 16 may be provided to allow external connections to the source wiring 20 and the gate wiring 22, respectively. On the other hand, the outer peripheral electrode 24 may be completely covered with the passivation layer 12. The configuration (for example, position, shape, size, number, etc.) of the pad openings 14 and 16 may be appropriately determined according to, for example, the design and usage of the semiconductor device 10, and is not limited to the illustrated example.

As shown in FIG. 2, the semiconductor device 10 may include a semiconductor layer 26. The metal layer 18 is formed on the semiconductor layer 26. The semiconductor layer 26 includes a first surface 26A and a second surface 26B on the opposite side of the first surface 26A (see FIG. 5). The Z direction shown in FIG. 2 corresponds to a direction orthogonal to the first surface 26A and the second surface 26B of the semiconductor layer 26.

The semiconductor layer 26 may be made of at least one of silicon (Si), silicon carbide (SiC), and gallium nitride (GaN). In one example, the semiconductor layer 26 may be made of Si. The second surface 26B of the semiconductor layer 26 may include two sides 26X1 and 26X2 extending along the X direction and two sides 26Y1 and 26Y2 extending along the Y direction. The outer edge of the semiconductor layer 26 may include four sides 26X1, 26X2, 26Y1, and 26Y2 in a plan view. In the present disclosure, the four sides 26X1, 26X2, 26Y1, and 26Y2 of the semiconductor layer 26 are also referred to as outer edges 26X1, 26X2, 26Y1, and 26Y2 of the semiconductor layer 26, respectively. A region defined by the outer edges 26X1, 26X2, 26Y1, and 26Y2 of the semiconductor layer 26 may correspond to one chip (die). The sides 26X1 and 26X2 extending along the X direction may have the same length and similarly, the sides 26Y1 and 26Y2 extending along the Y direction may have the same length. In the example of FIG. 2, the sides 26X1 and 26X2 may have a smaller length than the sides 26Y1 and 26Y2. In another example, the sides 26X1 and 26X2 may have the same length as the sides 26Y1 and 26Y2, or may have a larger length than the sides 26Y1 and 26Y2. In this manner, the outer edges 26X1, 26X2, 26Y1, and 26Y2 of the semiconductor layer 26 may be rectangular in a plan view and thus may have four corners.

The semiconductor layer 26 may include an outer peripheral region 28 and an inner region 30 surrounded by the outer peripheral region 28 in a plan view. A boundary between the outer peripheral region 28 and the inner region 30 is indicated by a two-dot chain line in FIG. 2. The inner region 30 may be rectangular in a plan view. The outer peripheral region 28 may include the outer edges 26X1, 26X2, 26Y1, and 26Y2 of the semiconductor layer 26. The outer peripheral region 28 may have a rectangular frame shape surrounding the inner region 30 in a plan view. Further details of the semiconductor layer 26 will be described later with reference to FIG. 5.

The source wiring 20 may include a recess 20A by having a notch which is substantially rectangular in a plan view. The recess 20A may be formed at the end of the source wiring 20 close to one of the four sides 26X1, 26X2, 26Y1, and 26Y2 of the semiconductor layer 26. In the example of FIG. 2, the recess 20A may be formed in the center in the X direction of the end of the source wiring 20 close to the side 26X2 of the semiconductor layer 26.

The gate wiring 22 may include a gate finger portion 32 and a gate pad portion 34. The gate finger portion 32 may be arranged in the outer peripheral region 28. The gate finger portion 32 may extend along at least a portion of the outer edges 26X1, 26X2, 26Y1, and 26Y2 of the semiconductor layer 26 and at least partially surround the source wiring 20. The gate pad portion 34 may be arranged over both the outer peripheral region 28 and the inner region 30. The gate pad portion 34 may be integrally connected to the gate finger portion 32. The gate pad portion 34 may be at least partially arranged within the recess 20A of the source wiring 20. In the example of FIG. 2, the gate pad portion 34 may be arranged to connect between two portions of the gate finger portion 32 extending along the side 26X2 in a plan view.

The outer peripheral electrode 24 may have a closed annular shape in a plan view. The outer peripheral electrode 24 may extend along the outer edges 26X1, 26X2, 26Y1, and 26Y2 of the semiconductor layer 26. The outer peripheral electrode 24 may be spaced apart from the four sides 26X1, 26X2, 26Y1, and 26Y2 of the semiconductor layer 26.

FIG. 3 schematically shows some components formed on the semiconductor layer 26. The semiconductor device 10 may further include a gate trench 36 formed in the semiconductor layer 26. The gate trench 36 is formed in both the outer peripheral region 28 and the inner region 30 of the semiconductor layer 26. The gate trench 36 may include an outer peripheral gate trench portion 38 arranged in the outer peripheral region 28, an inner gate trench portion 40 arranged in the inner region 30 (see FIG. 4), and a connection gate trench portion 42 which communicates the outer peripheral gate trench portion 38 with the inner gate trench portion 40.

The inner region 30 of the semiconductor layer 26 may include an active region 44 which contributes to the operation of the semiconductor device 10 as a transistor. The active region 44 may overlap the source wiring 20 in a plan view. The active region 44 may have a shape similar to the source wiring 20 including the recess 20A in a plan view. The active region 44 may be one size smaller than the source wiring 20 including the recess 20A in a plan view. The active region 44 is covered with the source wiring 20, but is not covered with the gate pad portion 34. The inner gate trench portion 40 may be arranged in the active region 44.

The outer peripheral gate trench portion 38 is formed in a closed annular shape along the outer edges 26X1, 26X2, 26Y1, and 26Y2 of the semiconductor layer 26 in the outer peripheral region 28. That is, the outer peripheral gate trench portion 38 extends along the four sides 26X1, 26X2, 26Y1, and 26Y2 of the semiconductor layer 26. The outer peripheral gate trench portion 38 may have the same number of corners of the outer edges 26X1, 26X2, 26Y1, and 26Y2 of the semiconductor layer 26 in a plan view. In the illustrated example, since the outer edges 26X1, 26X2, 26Y1, and 26Y2 of the semiconductor layer 26 have the four corners in a plan view, the outer peripheral gate trench portion 38 has the four corners in the outer peripheral region 28.

The outer peripheral gate trench portion 38 may be arranged so as to surround the inner region 30. The outer peripheral gate trench portion 38 does not enter the inner region 30. The outer peripheral gate trench portion 38 overlaps both the gate finger portion 32 and the gate pad portion 34 in a plan view.

In addition, the connection gate trench portion 42 overlaps the gate finger portion 32 in a plan view, but does not overlap the gate pad portion 34. The outer peripheral gate trench portion 38 extends along the outer edges 26X1, 26X2, 26Y1, and 26Y2 of the semiconductor layer 26, but not along the outer periphery of the active region 44. Therefore, the outer peripheral gate trench portion 38 located below the gate pad portion 34 and extending along the side 26X2 is spaced apart from the active region 44 by the dimension of the gate pad portion 34 in the Y direction. The outer peripheral gate trench portion 38 overlapping the gate pad portion 34 in a plan view is not directly connected to the inner gate trench portion 40 of the active region 44 by the connection gate trench portion 42.

The semiconductor device 10 may further include a protection trench 46 formed in the semiconductor layer 26. The protection trench 46 is formed in a closed annular shape along the outer edges 26X1, 26X2, 26Y1, and 26Y2 of the semiconductor layer 26 in the outer peripheral region 28. That is, the protection trench 46 extends along the four sides 26X1, 26X2, 26Y1, and 26Y2 of the semiconductor layer 26. The protection trench 46 may have the same number of corners of the outer edges 26X1, 26X2, 26Y1, and 26Y2 of the semiconductor layer 26 in a plan view. In the illustrated example, since the outer edges 26X1, 26X2, 26Y1, and 26Y2 of the semiconductor layer 26 have the four corners in a plan view, the protection trench 46 has the four corners in the outer peripheral region 28.

The protection trench 46 may be arranged so as to surround the outer peripheral gate trench portion 38. Therefore, the protection trench 46 does not enter the inner region 30. The outer peripheral gate trench portion 38 is surrounded by the protection trench 46 in a plan view. The semiconductor device 10 may include a plurality of protection trenches 46.

[Arrangement of Gate Trench and Protection Trench Around Gate Finger Portion]

Figure 4:
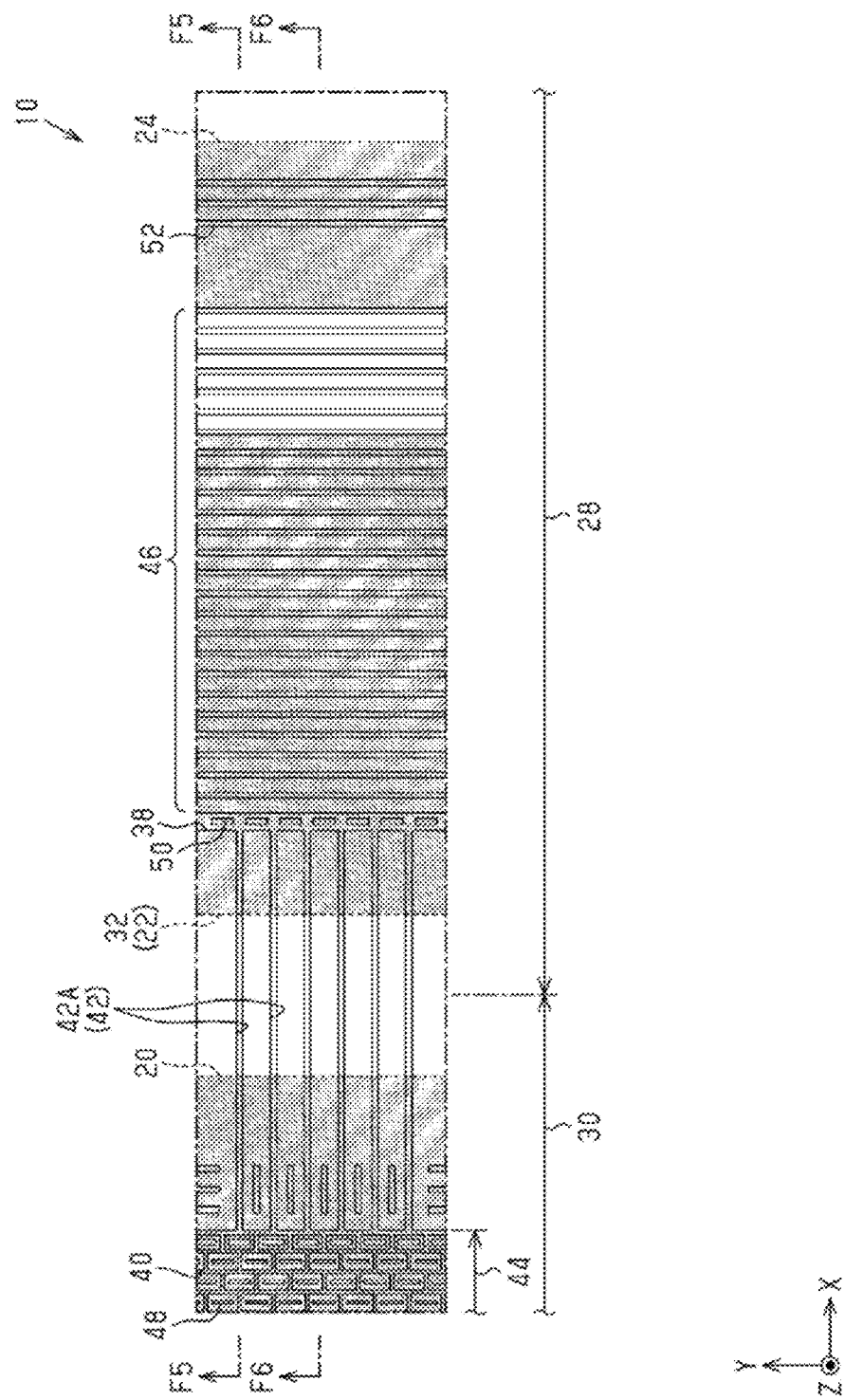
FIG. 4 is a partially enlarged view of FIG. 3.

FIG. 4 is a partially enlarged view of FIG. 3, in which a portion F4 surrounded by a dashed line in FIG. 3 is enlarged. For ease of understanding, the source wiring 20, the gate wiring 22 (the gate finger portion 32), and the outer peripheral electrode 24 are hatched with dots in FIG. 4.

As shown in FIG. 4, the inner gate trench portion 40 arranged in the active region 44 may be formed in a grid pattern. The semiconductor device 10 may further include a source contact portion 48 connected to the source wiring 20 and the source contact portion 48 may be arranged in a plurality of rectangular regions of the semiconductor layer 26 surrounded by the inner gate trench portion 40. In another example, the inner gate trench portion 40 may be formed in, for example, a stripe shape.

The outer peripheral gate trench portion 38 arranged in the outer peripheral region 28 may have a larger width than the inner gate trench portion 40. Here, the width of the outer peripheral gate trench portion 38 refers to a dimension in a direction orthogonal to the direction along the outer edges 26X1, 26X2, 26Y1, and 26Y2 of the semiconductor layer 26 along which the outer peripheral gate trench portion 38 extends. The width of the outer peripheral gate trench portion 38 may also be referred to as the width of the outer peripheral gate trench portion 38 in a lateral direction. For example, the outer peripheral gate trench portion 38 shown in FIG. 4 extends in the Y direction and has a width in the X direction. Similarly, the width of the inner gate trench portion 40 may refer to the width of the inner gate trench portion 40 in the lateral direction.

The semiconductor device 10 may further include a gate contact portion 50 connected to the gate wiring 22 (the gate finger portion 32) and the gate contact portion 50 may be arranged in a region overlapping the outer peripheral gate trench portion 38 in a plan view.

The connection gate trench portion 42, which communicates the outer peripheral gate trench portion 38 with the inner gate trench portion 40, is arranged over both the outer peripheral region 28 and the inner region 30. The connection gate trench portion 42 may extend in a direction (the X direction in FIG. 4) intersecting the extension direction (the Y direction in FIG. 4) of the outer peripheral gate trench portion 38. The connection gate trench portion 42 may include a plurality of connection gate trenches 42A arranged in a stripe shape.

The outer peripheral gate trench portion 38 is surrounded by the protection trench 46. In the example of FIG. 4, twenty-five protection trenches 46 are arranged in the outer peripheral region 28. The semiconductor device 10 may include one or more protection trenches 46 and the number of protection trenches 46 may be appropriately determined according to the desired performance and layout of the semiconductor device 10.

When the plurality of protection trenches 46 is provided as in the illustrated example, some of the protection trenches 46 may overlap the gate finger portion 32 in a plan view. Alternatively, all of the plurality of protection trenches 46 may overlap the gate finger portion 32 in a plan view.

The semiconductor device 10 may further include an outer peripheral contact portion 52 connected to the outer peripheral electrode 24. The outer peripheral contact portion 52 may be formed in a closed annular shape and the annular outer peripheral contact portion 52 may surround the protection trench 46 in a plan view. The semiconductor device 10 may include a plurality of outer peripheral contact portions 52.

The source contact portion 48, the gate contact portion 50, and the outer peripheral contact portion 52 may be made of any metal material. In one example, each of the contact portions 48, 50, and 52 may be made of at least one of tungsten (W), Ti, and titanium nitride (TiN).

Figure 5:
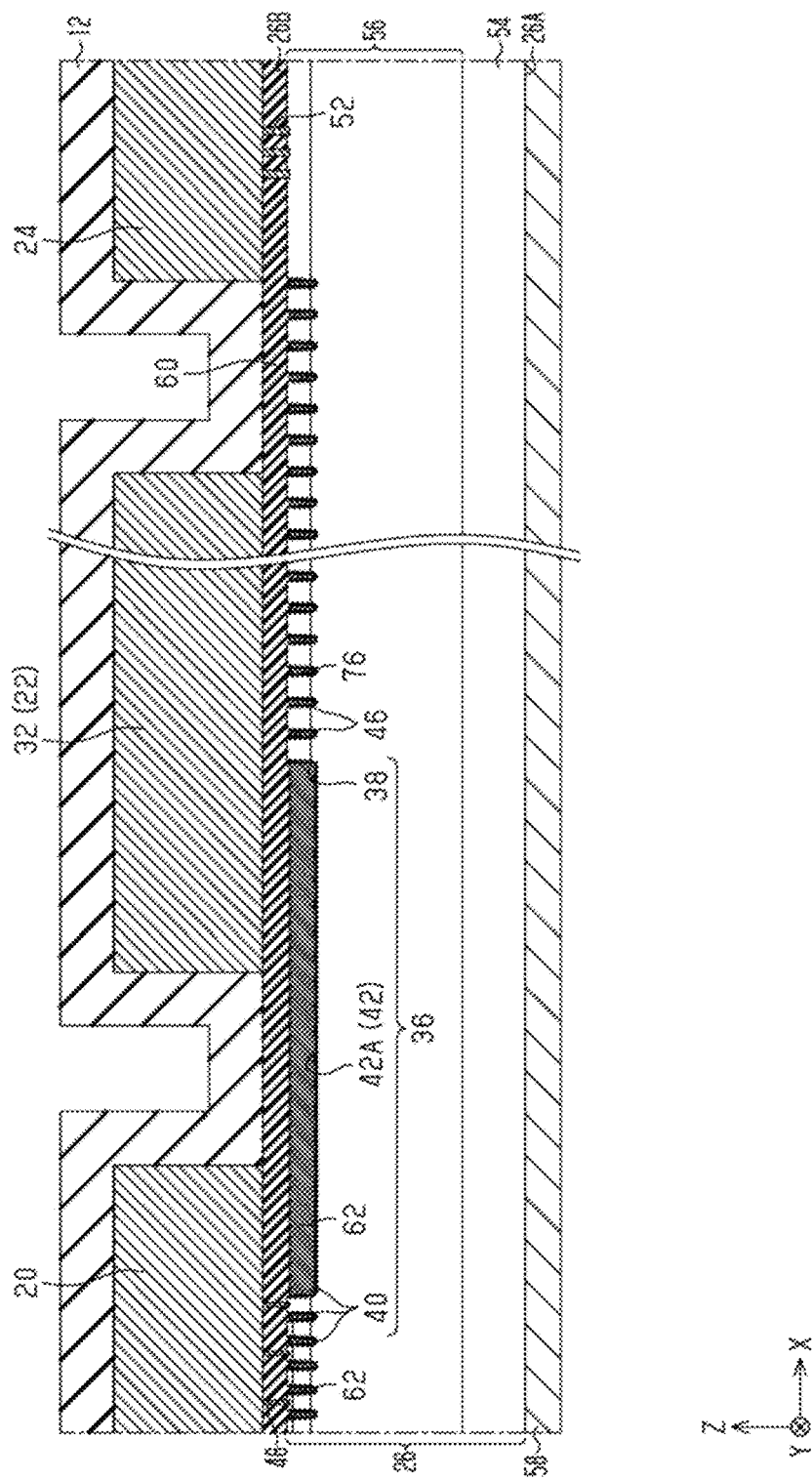
FIG. 5 is a schematic cross-sectional view of the semiconductor device taken along line F5-F5 in FIG. 4.

FIG. 5 is a schematic cross-sectional view of the semiconductor device 10 taken along line F5-F5 in FIG. 4. The semiconductor layer 26 may include a semiconductor substrate 54 having the first surface 26A of the semiconductor layer 26 and an epitaxial layer 56, which is formed on the semiconductor substrate 54 and has the second surface 26B of the semiconductor layer 26. In the present embodiment, the semiconductor substrate 54 may be a Si substrate. The semiconductor substrate 54 may correspond to a drain region of MISFET. The drain region (the semiconductor substrate 54) may be a p$^+$-type region containing p-type impurities. The impurity concentration of the semiconductor substrate 54 may be $1\times10^{18}$ cm$^{-3}$ or more and $1\times10^{20}$ cm$^{-3}$ or less. The semiconductor substrate 54 may have a thickness of 50 μm or more and 450 μm or less. The epitaxial layer 56 may be a Si layer epitaxially grown on the Si substrate. Further details of the epitaxial layer 56 will be described later with reference to FIGS. 7 and 8.

The semiconductor device 10 may further include a drain electrode 58 formed on the first surface 26A of the semiconductor layer 26. The drain electrode 58 is electrically connected to the drain region (the semiconductor substrate 54). The drain electrode 58 may be made of at least one of Ti, Ni, Au, Ag, Cu, Al, a Cu alloy, and an Al alloy.

The semiconductor device 10 may further include an insulating layer 60 formed on the semiconductor layer 26.

The insulating layer 60 may be formed of, for example, a silicon oxide film (SiO$_2$). The insulating layer 60 may additionally or alternatively include a film made of an insulating material different from SiO$_2$, such as SiN. The insulating layer 60 is in contact with the second surface 26B of the semiconductor layer 26. The source wiring 20, the gate wiring 22, and the outer peripheral electrode 24 are formed on the insulating layer 60. The passivation layer 12 at least partially covers the source wiring 20, the gate wiring 22, and the outer peripheral electrode 24 which are formed on the insulating layer 60. Portions of the insulating layer 60 which are not covered by the source wiring 20, the gate wiring 22, and the outer peripheral electrode 24 may also be covered with the passivation layer 12.

The gate trench 36 has an opening in the second surface 26B of the semiconductor layer 26 and has a depth in the Z direction. Similarly, the protection trench 46 also has an opening in the second surface 26B of the semiconductor layer 26 and has a depth in the Z direction. The gate trench 36 and the protection trench 46 are shown as having approximately the same depth, but may have different depths in another example. For example, the protection trench 46 may be formed to be deeper than the gate trench 36 within the semiconductor layer 26. Alternatively, the protection trench 46 may be formed to be shallower than the gate trench 36 within the semiconductor layer 26. In yet another example, the outer peripheral gate trench portion 38 and the inner gate trench portion 40 may have different depths. For example, the outer peripheral gate trench portion 38 may be formed to be deeper than the inner gate trench portion 40.

FIG. 5 shows a cross section along the longitudinal direction of one connection gate trench 42A included in the connection gate trench portion 42. Two end portions of the connection gate trench 42A communicate with the outer peripheral gate trench portion 38 and the inner gate trench portion 40, respectively. In this way, the outer peripheral gate trench portion 38, the inner gate trench portion 40, and the connection gate trench portion 42 can communicate with each other to form the gate trench 36.

Figure 7:
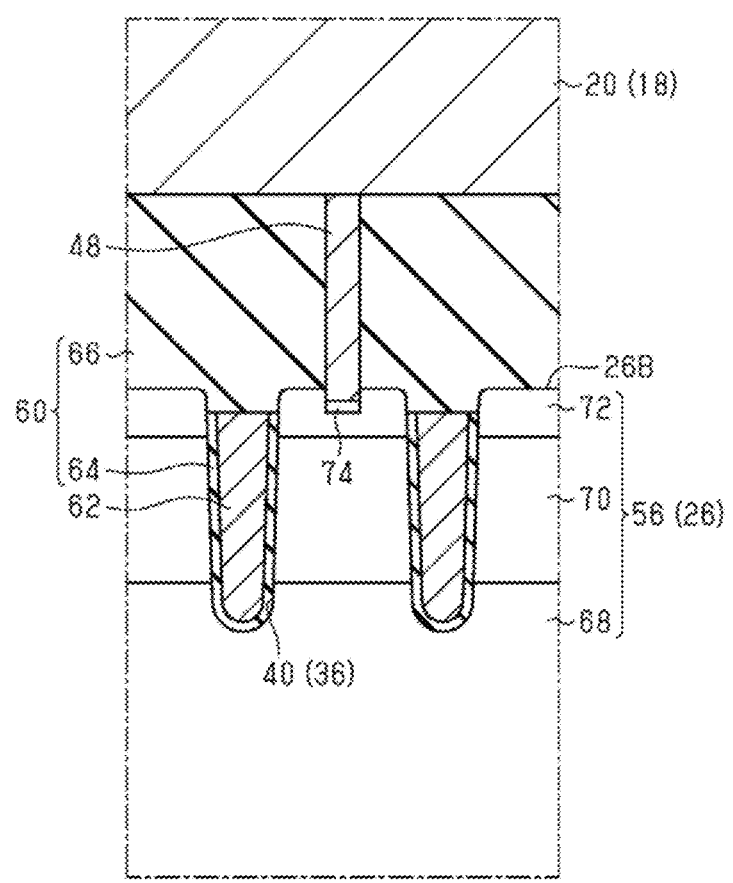
FIG. 7 is a partially enlarged view of FIG. 6.
Figure 8:
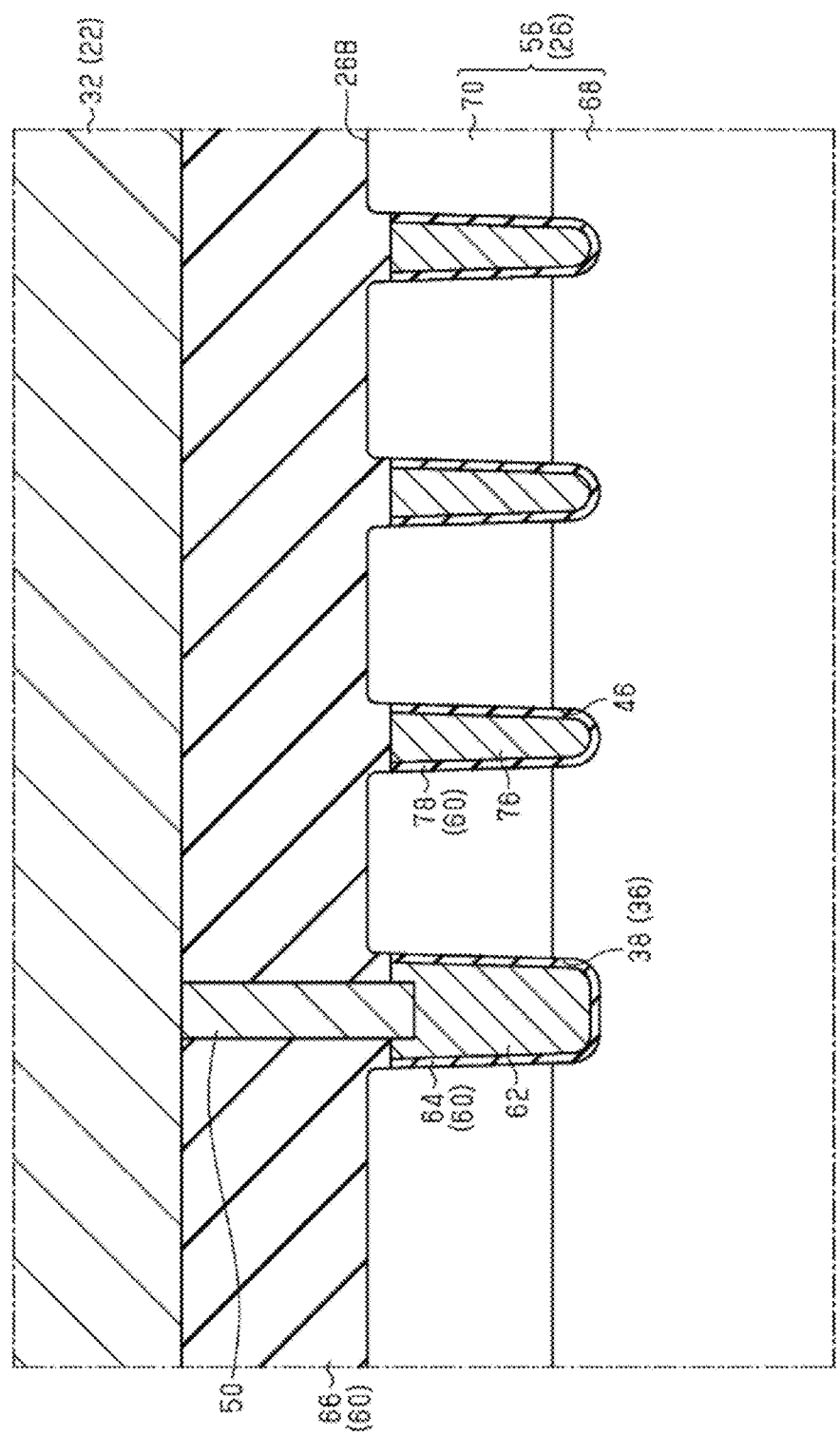
FIG. 8 is a partially enlarged view of FIG. 6.

A gate electrode 62, which will be described later with reference to FIGS. 7 and 8, is buried in the outer peripheral gate trench portion 38, the inner gate trench portion 40, and the connection gate trench portion 42 via the insulating layer 60. Since the outer peripheral gate trench portion 38, the inner gate trench portion 40, and the connection gate trench portion 42 communicate with one another, the integrally formed gate electrode 62 can be buried over the outer peripheral gate trench portion 38, the inner gate trench portion 40, and the connection gate trench portion 42.

The source contact portion 48 extends by passing through the insulating layer 60 between the source wiring 20 and the semiconductor layer 26, and connects the source wiring 20 and the semiconductor layer 26. The outer peripheral contact portion 52 extends by passing through the insulating layer 60 between the outer peripheral electrode 24 and the semiconductor layer 26, and connects the outer peripheral electrode 24 and the semiconductor layer 26.

Figure 6:
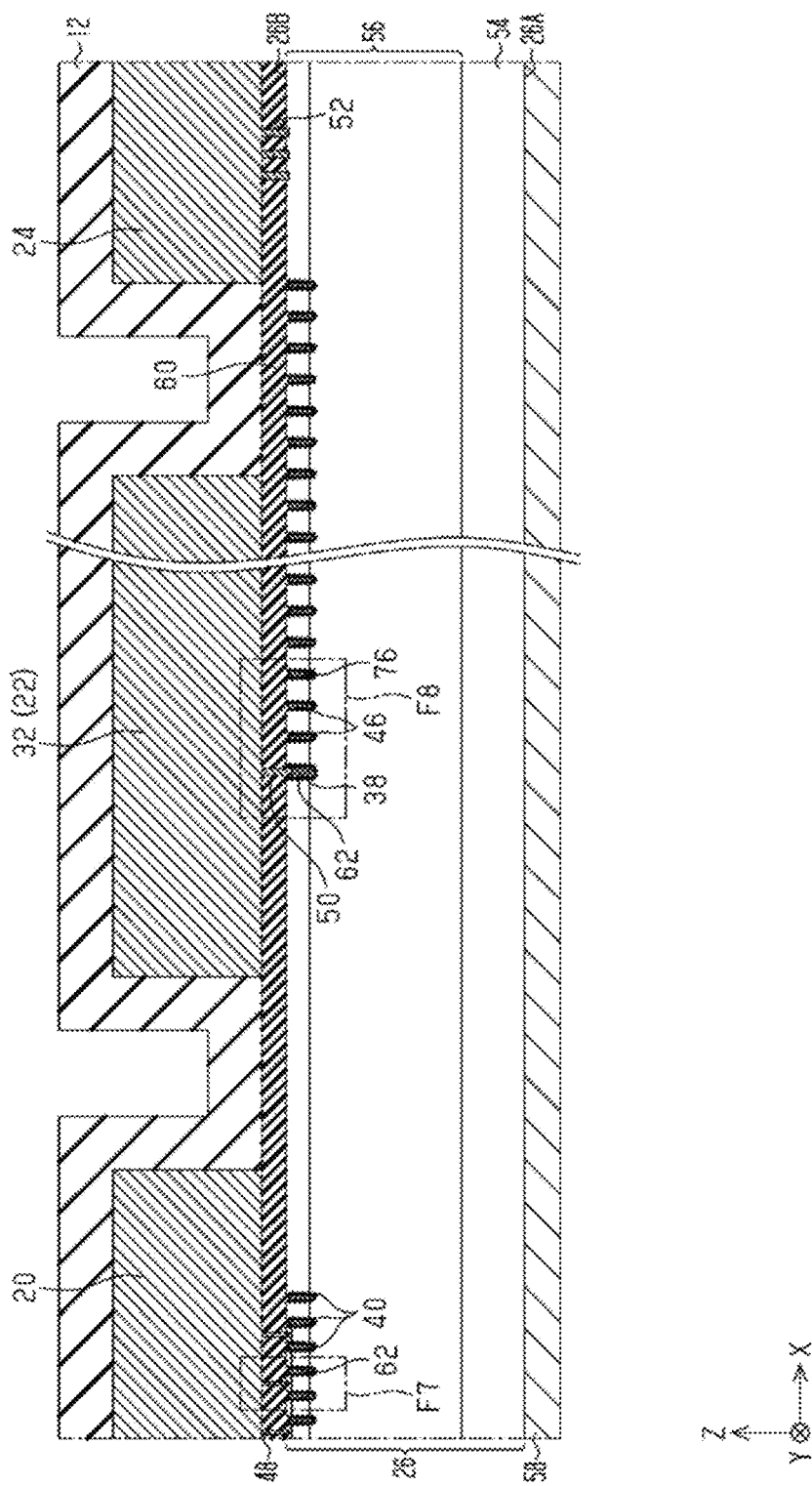
FIG. 6 is a schematic cross-sectional view of the semiconductor device taken along line F6-F6 in FIG. 4.

FIG. 6 is a schematic cross-sectional view of the semiconductor device 10 taken along line F6-F6 of FIG. 4, showing a region between two connection gate trenches 42A. Regarding FIG. 6, explanation of the configuration similar to that of FIG. 5 will be omitted.

FIG. 6 shows a portion of the outer peripheral gate trench portion 38 which is not in direct communication with the connection gate trench 42A. As described and shown above, the outer peripheral gate trench portion 38 may have a larger width than the inner gate trench portion 40. In one example, the outer peripheral gate trench portion 38 may have a width that is 1.2 to 2.5 times the width of the inner gate trench portion 40.

The gate contact portion 50 extends by passing through the insulating layer 60 and connects the gate finger portion 32 and the gate electrode 62 buried in the outer peripheral gate trench portion 38 (see FIG. 8). Therefore, the gate wiring 22 is electrically connected to the gate electrode 62.

FIG. 7 is a partially enlarged view of FIG. 6, in which a portion F7 surrounded by a dashed line in FIG. 6 is enlarged. FIG. 7 is a cross-sectional view of the active region 44 (see FIG. 3). The semiconductor device 10 may further include a gate electrode 62 buried in the gate trench 36 via an insulating layer 60. The gate electrode 62 may be made of, for example, conductive polysilicon. The insulating layer 60 may include a gate insulating film 64, which is interposed between the gate electrode 62 and the semiconductor layer 26 and covers the gate trench 36, and an interlayer insulating film 66 formed between the metal layer 18 and the semiconductor layer 26. The gate electrode 62 is spaced apart from the semiconductor layer 26 by the gate insulating film 64.

FIG. 7 shows the gate insulating film 64 which is interposed between the gate electrode 62 and the semiconductor layer 26 and covers the inner gate trench portion 40, and the interlayer insulating film 66 formed between the source wiring 20 and the semiconductor layer 26.

The semiconductor layer 26 (the epitaxial layer 56) may include a drift region 68, a body region 70 formed on the drift region 68, and a source region 72 formed on the body region 70. The source region 72 may include the second surface 26B of the semiconductor layer 26. The semiconductor layer 26 (the epitaxial layer 56) may further include a contact region 74 located below the source contact portion 48. The source wiring 20 is electrically connected to the contact region 74 via the source contact portion 48.

The drift region 68 may be a p-type region containing p-type impurities having a lower concentration than that of the drain region (the semiconductor substrate 54). The impurity concentration of the drift region 68 may be $1\times10^{15}$ cm$^{-3}$ or more and $1\times10^{18}$ cm$^{-3}$ or less. The drift region 68 may have a thickness of 1 µm or more and 25 µm or less.

The body region 70 may be an n-type region containing n-type impurities. The source region 72 may be a p$^+$-type region containing p-type impurities having a higher concentration than that of the drift region 68. The impurity concentration of the body region 70 may be $1\times10^{16}$ cm$^{-3}$ or more and $1\times10^{18}$ cm$^{-3}$ or less. The body region 70 may have a thickness of 0.5 µm or more and 1.5 µm or less.

The source region 72 may be a p$^+$-type region containing p-type impurities having a higher concentration than that of the drift region 68. The impurity concentration of the source region 72 may be $1\times10^{19}$ cm$^{-3}$ or more and $1\times10^{21}$ cm$^{-3}$ or less. The source region 72 may have a thickness of 0.1 µm or more and 1 µm or less.

The contact region 74 may be an n$^+$-type region containing n-type impurities. The impurity concentration of the contact region 74 is higher than that of the body region 70 and may be $1\times10^{19}$ cm$^{-3}$ or more and $1\times10^{21}$ cm$^{-3}$ or less.

In the present disclosure, the p-type is also called a first conductivity type and the n-type is also called a second conductivity type. The p-type impurities may be, for example, boron (B), aluminum (Al), or the like. The n-type impurities may be, for example, phosphorus (P), arsenic (As), or the like.

The inner gate trench portion 40 has an opening in the second surface 26B of the semiconductor layer 26 and reaches the drift region 68 through the source region 72 and the body region 70. A sidewall of the inner gate trench portion 40 may or may not extend in the direction (the Z direction) orthogonal to the second surface 26B of the semiconductor layer 26. In the illustrated example, the inner gate trench portion 40 may have a sidewall which slopes slightly with respect to the Z direction.

When a predetermined voltage is applied to the gate electrode 62, a channel is formed in the n⁻-type body region 70 adjacent to the gate insulating film 64. The semiconductor device 10 may be capable of controlling a flow of holes in the Z direction between p⁺-type source region 72 and the p⁻-type drift region 68 through this channel.

FIG. 8 is a partially enlarged view of FIG. 6, in which a portion F8 surrounded by a dashed line in FIG. 6 is enlarged. FIG. 8 shows a cross-sectional view of the outer peripheral region 28 (see FIG. 3), particularly a region covered by the gate finger portion 32.

As described above, the gate electrode 62 is also buried in the outer peripheral gate trench portion 38 via the insulating layer 60. Since the outer peripheral gate trench portion 38 has a larger width than the inner gate trench portion 40, the gate electrode 62 may have a larger width inside the outer peripheral gate trench portion 38 than that inside the inner gate trench portion 40. Similarly, the gate insulating film 64 may be formed to be thicker inside the outer peripheral gate trench portion 38 than that inside the inner gate trench portion 40.

The gate contact portion 50 extends by passing through the insulating layer 60 (the interlayer insulating film 66) located between the gate electrode 62 and the gate finger portion 32 and connects the gate electrode 62 buried in the outer peripheral gate trench portion 38 to the gate finger portion 32.

The protection trench 46 may be arranged with a gap from the outer peripheral gate trench portion 38. When a plurality of protection trenches 46 are provided, the plurality of protection trenches 46 may also be arranged to be spaced apart from one another. As in the illustrated example, the protection trench 46 may have a smaller width than the outer peripheral gate trench portion 38. In another example, the protection trench 46 may have the same width as the outer peripheral gate trench portion 38, or may have a larger width than the outer peripheral gate trench portion 38.

The semiconductor device 10 may further include a protection electrode 76 buried in the protection trench 46 via the insulating layer 60. In one example, the protection electrode 76 may be made of conductive polysilicon. Since the protection trench 46 is formed in a closed annular shape in a plan view, the protection electrode 76 may also be formed in a closed annular shape in a plan view. The insulating layer 60 may further include a protection insulating film 78, which is interposed between the protection electrode 76 and the semiconductor layer 26 and covers the protection trench 46. The protection electrode 76 is spaced apart from the semiconductor layer 26 by the protection insulating film 78. The protection electrode 76 buried in the protection trench 46 may be in an electrical floating state without being connected to other metal members (for example, the gate finger portion 32).

As shown in FIG. 8, in regions other than the active region 44 (see FIG. 3), the semiconductor layer 26 does not include the source region 72 but includes the drift region 68 and the body region 70. Therefore, in a region shown in FIG. 8, the second surface 26B of the semiconductor layer 26 is included in the body region 70. The outer peripheral gate trench portion 38 and the protection trench 46 have openings in the second surface 26B of the semiconductor layer 26 and reach the drift region 68 through the body region 70. The sidewalls of the outer peripheral gate trench portion 38 and the protection trench 46 may or may not extend in a direction (the Z direction) orthogonal to the second surface 26B of the semiconductor layer 26. In the illustrated example, the outer peripheral gate trench portion 38 and the protection trench 46 may have sidewalls that slope slightly with respect to the Z direction.

[Arrangement of Gate Trench and Protection Trench Around Gate Pad Portion]

Figure 9:
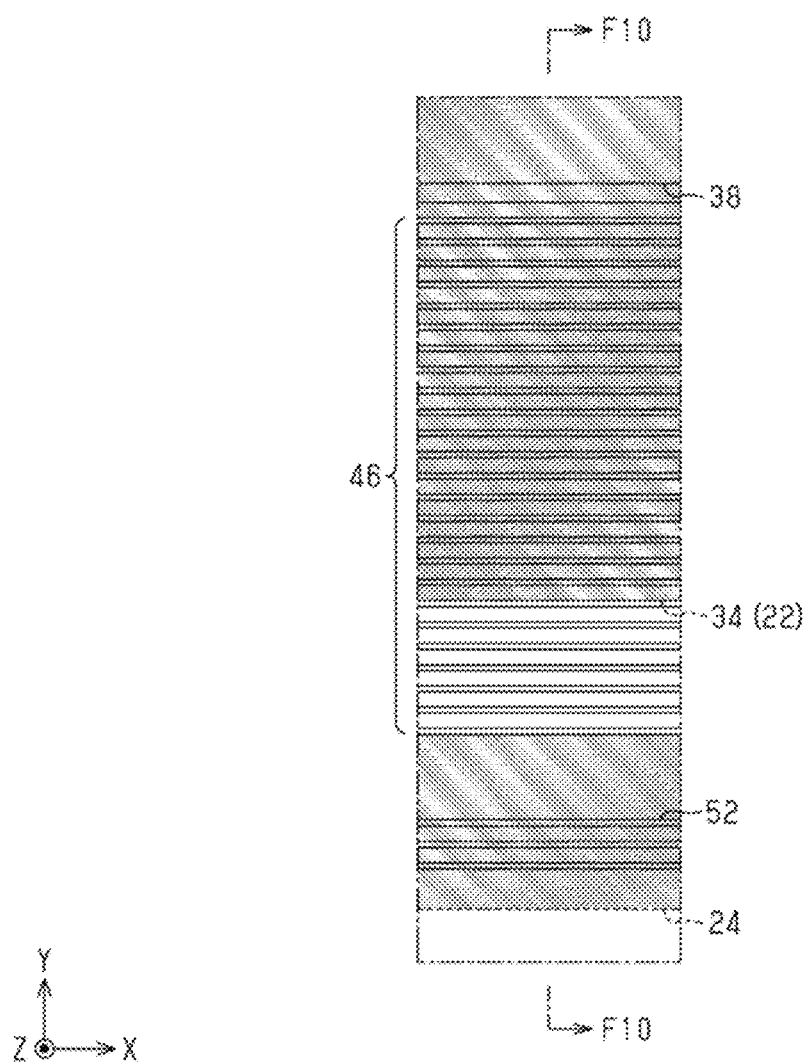
FIG. 9 is a partially enlarged view of FIG. 3.

FIG. 9 is a partially enlarged view of FIG. 3, in which a portion F9 surrounded by a dashed line in FIG. 3 is enlarged. For ease of understanding, the gate wiring 22 (the gate pad portion 34) and the outer peripheral electrode 24 are hatched in dots in FIG. 9.

The inner gate trench portion 40 and the connection gate trench portion 42 do not exist in a region overlapping the gate pad portion 34 in a plan view. On the other hand, the outer peripheral gate trench portion 38 and the protection trench 46 extend substantially parallel to each other, as in the case of FIG. 4.

When a plurality of protection trenches 46 is provided as in the illustrated example, some of the protection trenches 46 may overlap the gate pad portion 34 in a plan view. Alternatively, all of the plurality of protection trenches 46 may overlap the gate pad portion 34 in a plan view.

Figure 10:
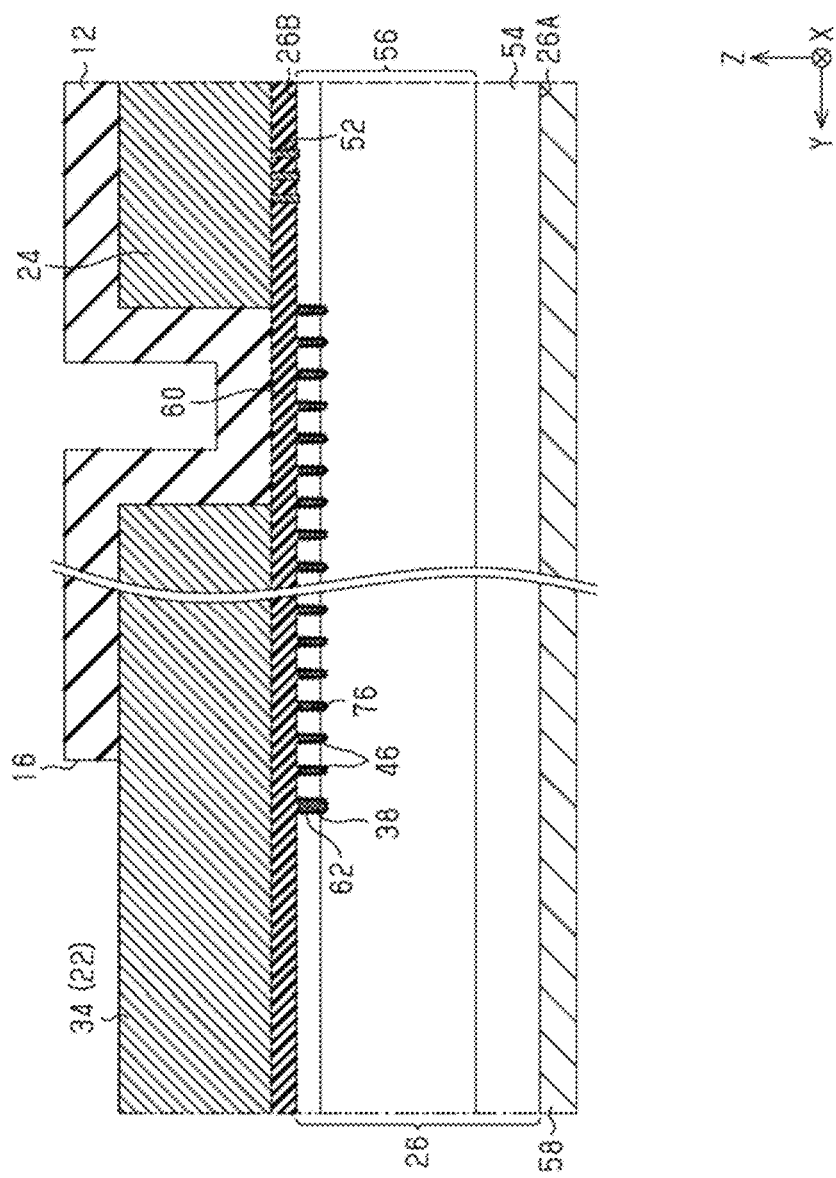
FIG. 10 is a schematic cross-sectional view of the semiconductor device taken along line F10-F10 in FIG. 9.

FIG. 10 is a schematic cross-sectional view of the semiconductor device 10 taken along line F10-F10 in FIG. 9. Similar to the regions shown in FIGS. 5 and 6, the outer peripheral gate trench portion 38 and the protection trench 46 are formed in the semiconductor layer 26. A region shown in FIG. 10 is relatively far away from the active region 44 (see FIG. 3). A region covered with the gate pad portion 34 including the region shown in FIG. 10 is not provided with the connection gate trench portion 42 communicating with the inner gate trench portion 40 arranged in the active region 44 (see FIG. 3).

Operation

The operation of the semiconductor device 10 of the present embodiment will be described below. In the semiconductor device 10 of the present embodiment, the outer peripheral gate trench portion 38 and the protection trench 46 are formed in a closed annular shape along the outer edges 26X1, 26X2, 26Y1, and 26Y2 of the semiconductor layer 26 in the outer peripheral region 28.

A drain-source leakage current $I_{DSS}$ (also called a drain cutoff current) in MOSFET may increase due to local electric field concentration in a semiconductor chip. According to the semiconductor device 10 of the present embodiment, by providing the closed annular-shaped outer peripheral gate trench portion 38 and the closed annular-shaped protection trench 46 in the outer peripheral region 28, a depletion layer can effectively extend to the outer peripheral region 28. As a result, electric field concentration in the outer peripheral region 28 can be relaxed, so that an increase in drain-source leakage current $I_{DSS}$ in the semiconductor device 10 can be suppressed.

[Relationship Between Gate Trench Layout and Drain-Source Leakage Current $I_{DSS}$]

The effect of suppressing the drain-source leakage current $I_{DSS}$ by the semiconductor device 10 of the present embodiment will be further described below using Comparative Examples 1 and 2.

Comparative Example 1

Figure 11:
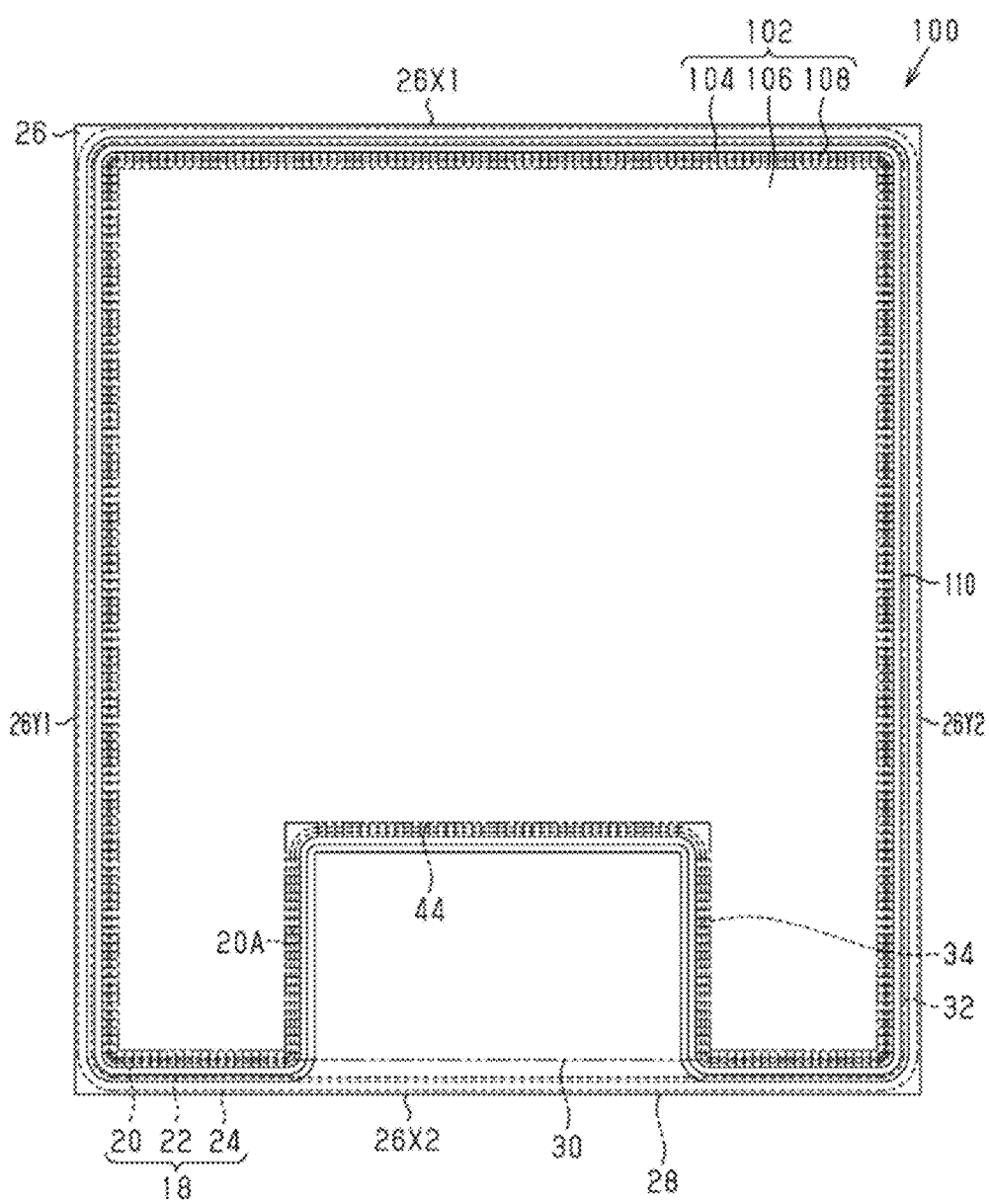
FIG. 11 is a schematic plan view of a semiconductor device according to Comparative Example 1.

FIG. 11 is a schematic plan view of a semiconductor device 100 according to Comparative Example 1. In FIG. 11, the same components as in the semiconductor device 10 (in particular, see FIG. 3) are denoted by the same reference numerals. Further, detailed explanation of the same components as in the semiconductor device 10 will be omitted.

The semiconductor device 100 includes a gate trench 102 formed in the semiconductor layer 26. The gate trench 102 is formed in both the outer peripheral region 28 and the inner region 30 of the semiconductor layer 26. The gate trench 102 includes an outer peripheral gate trench portion 104, an inner gate trench portion 106 arranged in the inner region 30, and a connection gate trench portion 108 which communicates the outer peripheral gate trench portion 104 with the inner gate trench portion 106.

The outer peripheral gate trench portion 104 and the connection gate trench portion 108 are arranged along the outer periphery of the active region 44 instead of the outer edges 26X1, 26X2, 26Y1, and 26Y2 of the semiconductor layer 26. The outer peripheral gate trench portion 104 overlapping the gate pad portion 34 in a plan view is directly connected to the inner gate trench portion 106 of the active region 44 by the connection gate trench portion 108.

The outer peripheral gate trench portion 104 is formed in a closed annular shape along the outer periphery of the active region 44. The outer peripheral gate trench portion 104 extends along the outer edge of the gate pad portion 34 close to the source wiring 20 and enters the inner region 30. Thus, the outer peripheral gate trench portion 104 has six corners in the outer peripheral region 28 and two corners in the inner region 30.

The semiconductor device 100 further includes a protection trench 110 formed in the semiconductor layer 26. The protection trench 110 is formed in a closed annular shape along the outer periphery of the active region 44. The protection trench 110 extends along the outer edge of the gate pad portion 34 close to the source wiring 20 and enters the inner region 30. Thus, the protection trench 110 has six corners in the outer peripheral region 28 and two corners in the inner region 30. The outer peripheral gate trench portion 104 is surrounded by the protection trench 110 in a plan view.

In this way, the semiconductor device 100 is different from the semiconductor device 10 in that the outer peripheral gate trench portion 104, the connection gate trench portion 108, and the protection trench 110 are arranged along the outer periphery of the active region 44. The outer peripheral gate trench portion 38 and the protection trench 46 of the semiconductor device 10 have no corners in the inner region 30, whereas the outer peripheral gate trench portion 104 and the protection trench 110 of the semiconductor device 100 have two corners in the inner region 30.

Comparative Example 2

Figure 12:
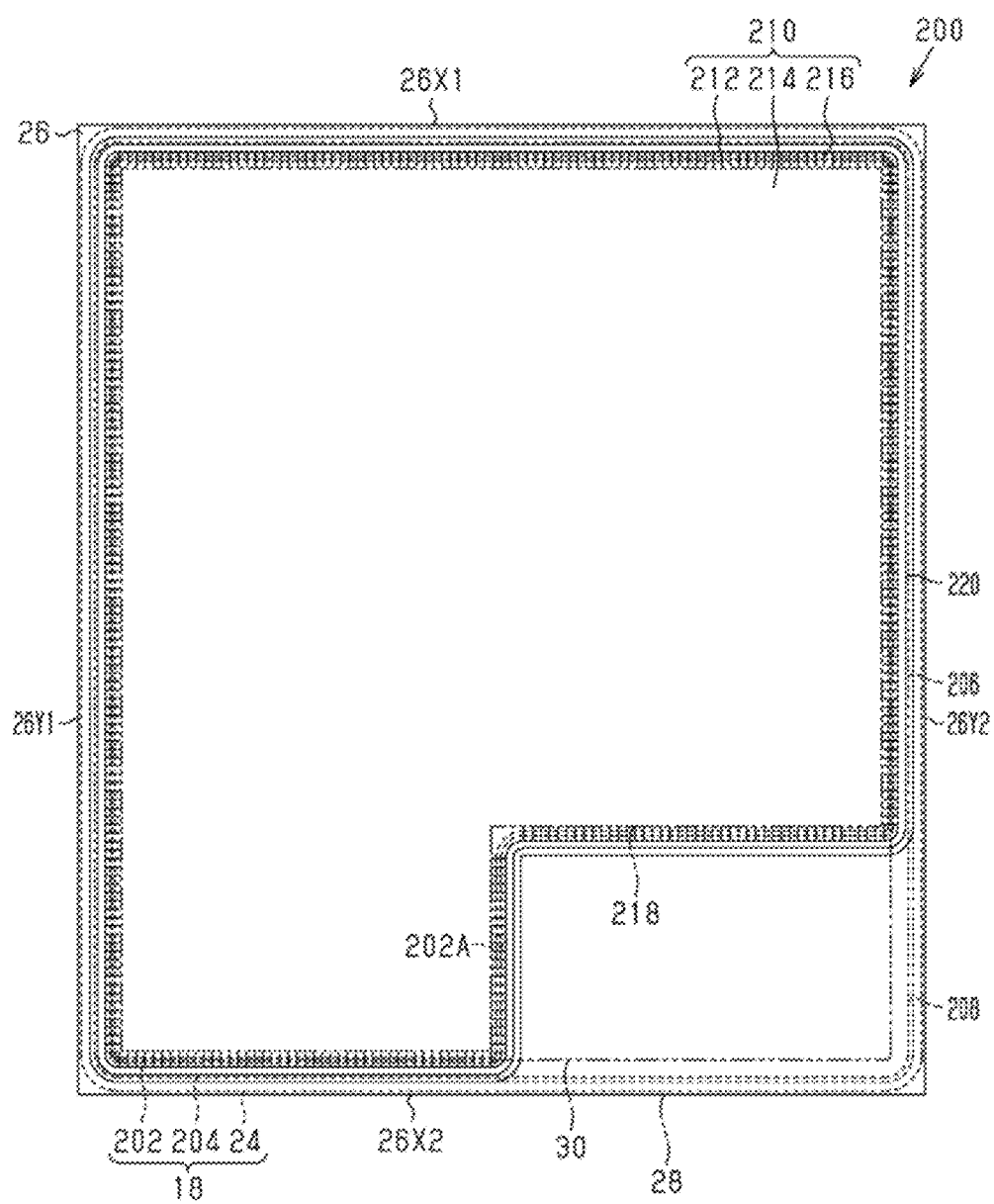
FIG. 12 is a schematic plan view of a semiconductor device according to Comparative Example 2.

FIG. 12 is a schematic plan view of a semiconductor device 200 according to Comparative Example 2. In FIG. 12, the same components as in the semiconductor device 10 (in particular, see FIG. 3) are denoted by the same reference numerals. Further, detailed explanation of the same components as in the semiconductor device 10 will be omitted.

The semiconductor device 200 includes a source wiring 202 and a gate wiring 204. The source wiring 202 includes a recess 202A by having a notch that is substantially rectangular in a plan view. The recess 202A is formed in a region near a point where the side 26X2 and the side 26Y2 of the semiconductor layer 26 intersect each other.

The gate wiring 204 includes a gate finger portion 206 and a gate pad portion 208. The gate finger portion 206 is arranged in the outer peripheral region 28. The gate finger portion 206 extends along portions of the outer edges 26X1, 26X2, 26Y1, and 26Y2 of the semiconductor layer 26 and partially surrounds the source wiring 202. The gate pad portion 208 is arranged across both the outer peripheral region 28 and the inner region 30. The gate pad portion 208 is integrally connected to the gate finger portion 206. The gate pad portion 208 is at least partially arranged within the recess 202A of the source wiring 202. The gate pad portion 208 is arranged to connect between a portion of the gate finger portion 206 extending along the side 26X2 and a portion thereof extending along the side 26Y2.

The semiconductor device 200 further includes a gate trench 210 formed in the semiconductor layer 26. The gate trench 210 is formed in both the outer peripheral region 28 and the inner region 30 of the semiconductor layer 26. The gate trench 210 includes an outer peripheral gate trench portion 212, an inner gate trench portion 214 arranged in the inner region 30, and a connection gate trench portion 216 that communicates the outer peripheral gate trench portion 212 with the inner gate trench portion 214.

The inner region 30 of the semiconductor layer 26 includes an active region 218. The active region 218 overlaps the source wiring 202 in a plan view. The active region 218 may have a shape similar to the source wiring 202 including the recess 202A in a plan view. The active region 218 is one size smaller than the source wiring 202 including the recess 202A in a plan view. The active region 218 is covered with the source wiring 202, but is not covered with the gate pad portion 208.

The inner gate trench portion 214 is arranged in the active region 218. The outer peripheral gate trench portion 212 and the connection gate trench portion 216 are arranged along the outer periphery of the active region 218 instead of the outer edges 26X1, 26X2, 26Y1, and 26Y2 of the semiconductor layer 26. The outer peripheral gate trench portion 212 overlapping the gate pad portion 208 in a plan view is directly connected to the inner gate trench portion 214 of the active region 218 by the connection gate trench portion 216.

The outer peripheral gate trench portion 212 is formed in a closed annular shape along the outer periphery of the active region 218. The outer peripheral gate trench portion 212 extends along the outer edge of the gate pad portion 208 close to the source wiring 202 and enters the inner region 30. Thus, the outer peripheral gate trench portion 212 has five corners in the outer peripheral region 28 and one corner in the inner region 30.

The semiconductor device 200 further includes a protection trench 220 formed in the semiconductor layer 26. The protection trench 220 is formed in a closed annular shape along the outer periphery of the active region 218. The protection trench 220 extends along the outer edge of the gate pad portion 208 close to the source wiring 202 and enters the inner region 30. Thus, the protection trench 220 has five corners in the outer peripheral region 28 and one corner in the inner region 30. The outer peripheral gate trench portion 212 is surrounded by the protection trench 220 in a plan view.

In this way, the semiconductor device 200 is different from the semiconductor device 10 in that the outer peripheral gate trench portion 212, the connection gate trench portion 216, and the protection trench 220 are arranged along the outer periphery of the active region 218. Further, the semiconductor device 200 is different from the semiconductor devices 10 and 100 in that the gate pad portion 208 is arranged close to the corner where the sides 26X2 and 26Y2 of the semiconductor layer 26 intersect each other.

The outer peripheral gate trench portion 38 and the protection trench 46 of the semiconductor device 10 have no corners in the inner region 30, whereas the outer peripheral gate trench portion 212 and the protection trench 220 of the semiconductor device 200 have one corner in the inner region 30.

Comparison Between Example and Comparative Example

Figure 13:
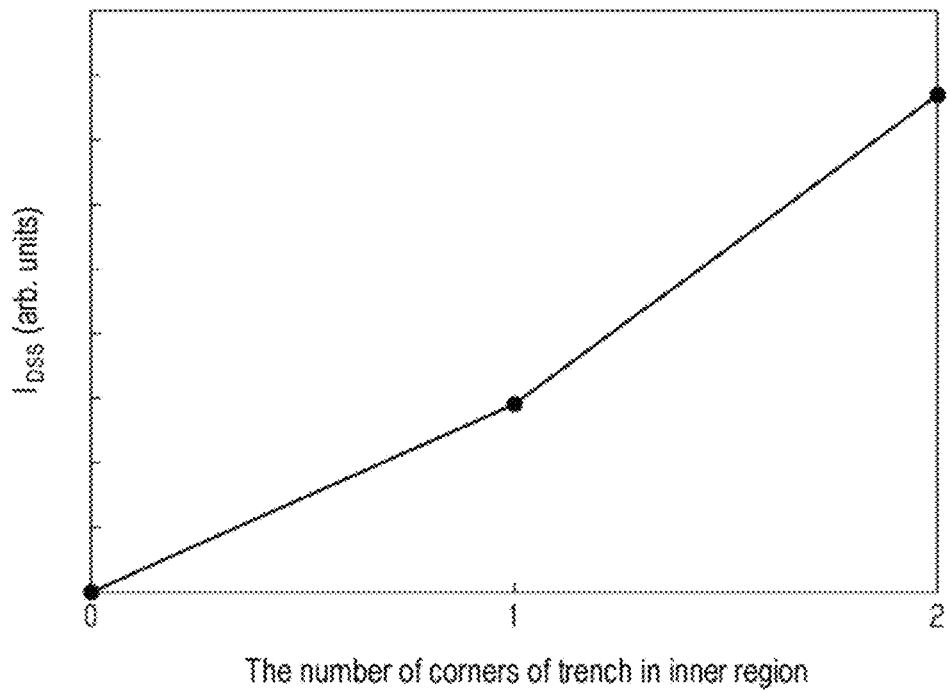
FIG. 13 is a graph showing a relationship between the number of trench corners in an inner region and a drain-source leakage current $I_{DSS}$.

FIG. 13 is a graph showing a relationship between the number of corners of the outer peripheral gate trench portion (or the protection trench) in the inner region and the drain-source leakage current $I_{DSS}$. The vertical axis of the graph indicates the drain-source leakage current $I_{DSS}$ and the horizontal axis thereof indicates the number of corners of the outer peripheral gate trench portion (or the protection trench) in the inner region 30. Since the protection trench runs parallel to the outer peripheral gate trench portion, the number of corners in the protection trench is the same as that of the outer peripheral gate trench portion. The drain-source leakage current $I_{DSS}$ is measured by applying a predetermined voltage (here, a rated voltage) between the drain and the source while short-circuiting between the gate and the source.

In Example corresponding to the semiconductor device 10, the number of corners is 0 and the drain-source leakage current $I_{DSS}$ is relatively small. On the other hand, in Comparative Example 1, the number of corners is two and the drain-source leakage current $I_{DSS}$ is relatively large. In Comparative Example 2, the number of corners is 1 and the drain-source leakage current $I_{DSS}$ is moderate.

Figure 14:
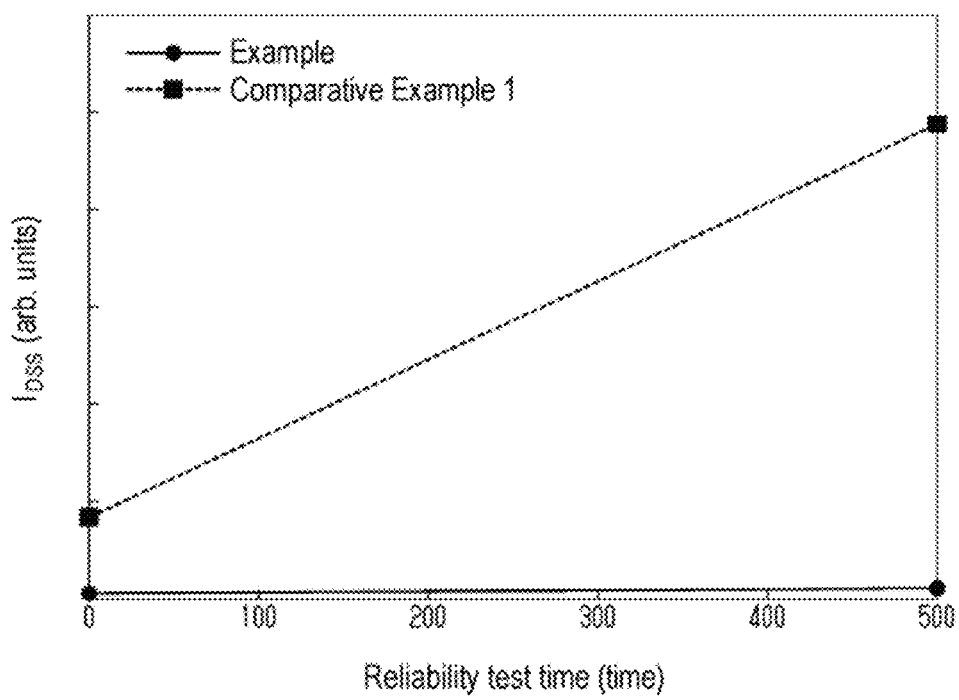
FIG. 14 is a graph showing a temporal change in the drain-source leakage current $I_{DSS}$ in a reliability test.

In this way, the drain-source leakage current $I_{DSS}$ can be reduced as the number of corners of the outer peripheral gate trench portion and the protection trench in the inner region is made smaller. FIG. 14 is a graph showing a temporal change in the drain-source leakage current $I_{DSS}$ in a reliability test. The vertical axis of the graph indicates the drain-source leakage current $I_{DSS}$ and the horizontal axis thereof indicates the reliability test time. In the graph, the drain-source leakage current $I_{DSS}$ of Example corresponding to the semiconductor device 10 and the drain-source leakage current $I_{DSS}$ of Comparative Example 1 corresponding to the semiconductor device 100 are plotted.

The drain-source leakage current $I_{DSS}$ of Comparative Example 1 increases significantly over time. On the other hand, the drain-source leakage current $I_{DSS}$ of Example corresponding to the semiconductor device 10 is smaller than the drain-source leakage current $I_{DSS}$ of Comparative Example 1 at the start of the test, and increases only slightly over time.

In this way, by adopting the layout of the semiconductor device 10 of the present embodiment, it is possible to suppress an increase in the drain-source leakage current $I_{DSS}$.

Effects

The semiconductor device 10 of the present embodiment has the following advantages.

(1) The outer peripheral gate trench portion 38 and the protection trench 46 are formed in a closed annular shape along the outer edges 26X1, 26X2, 26Y1, and 26Y2 of the semiconductor layer 26 in the outer peripheral region 28.

According to this configuration, the outer peripheral gate trench portion 38 and the protection trench 46 have no corners in the inner region 30. Further, electric field concentration in a region surrounded by the outer peripheral gate trench portion 38 and the protection trench 46 can be relaxed. As a result, it is possible to suppress an increase in the drain-source leakage current $I_{DSS}$ in the semiconductor device 10.

(2) The protection electrode 76 buried in the protection trench 46 via the insulating layer 60 is formed in a closed annular shape in a plan view. According to this configuration, electric field concentration in a region surrounded by the protection electrode 76 can be relaxed, so that an increase in the drain-source leakage current $I_{DSS}$ in the semiconductor device 10 can be further suppressed.

(3) The connection gate trench portion 42 overlaps the gate finger portion 32 in a plan view, but does not overlap the gate pad portion 34. According to this configuration, since the connection gate trench portion 42 is not arranged along the active region 44, the number of the corner of the outer peripheral gate trench portion 38 in the inner region 30 can be made zero. Therefore, it is possible to suppress an increase in the drain-source leakage current $I_{DSS}$ in the semiconductor device 10.

(4) The width of the outer peripheral gate trench portion 38 is larger than the width of the inner gate trench portion 40. According to this configuration, the gate insulating film 64 formed in the outer peripheral gate trench portion 38 can be made thicker than in the inner gate trench portion 40, so that the breakdown voltage of the semiconductor device 10 can be improved.

(5) The outer peripheral electrode 24 is spaced apart from the gate wiring 22 and surrounds the gate wiring 22. According to this configuration, electric field concentration in a region surrounded by the outer peripheral electrode 24 can be relaxed, so that the breakdown voltage of the semiconductor device 10 can be improved.

Modifications

The above embodiment can be further modified and implemented as follows.

Figure 15:
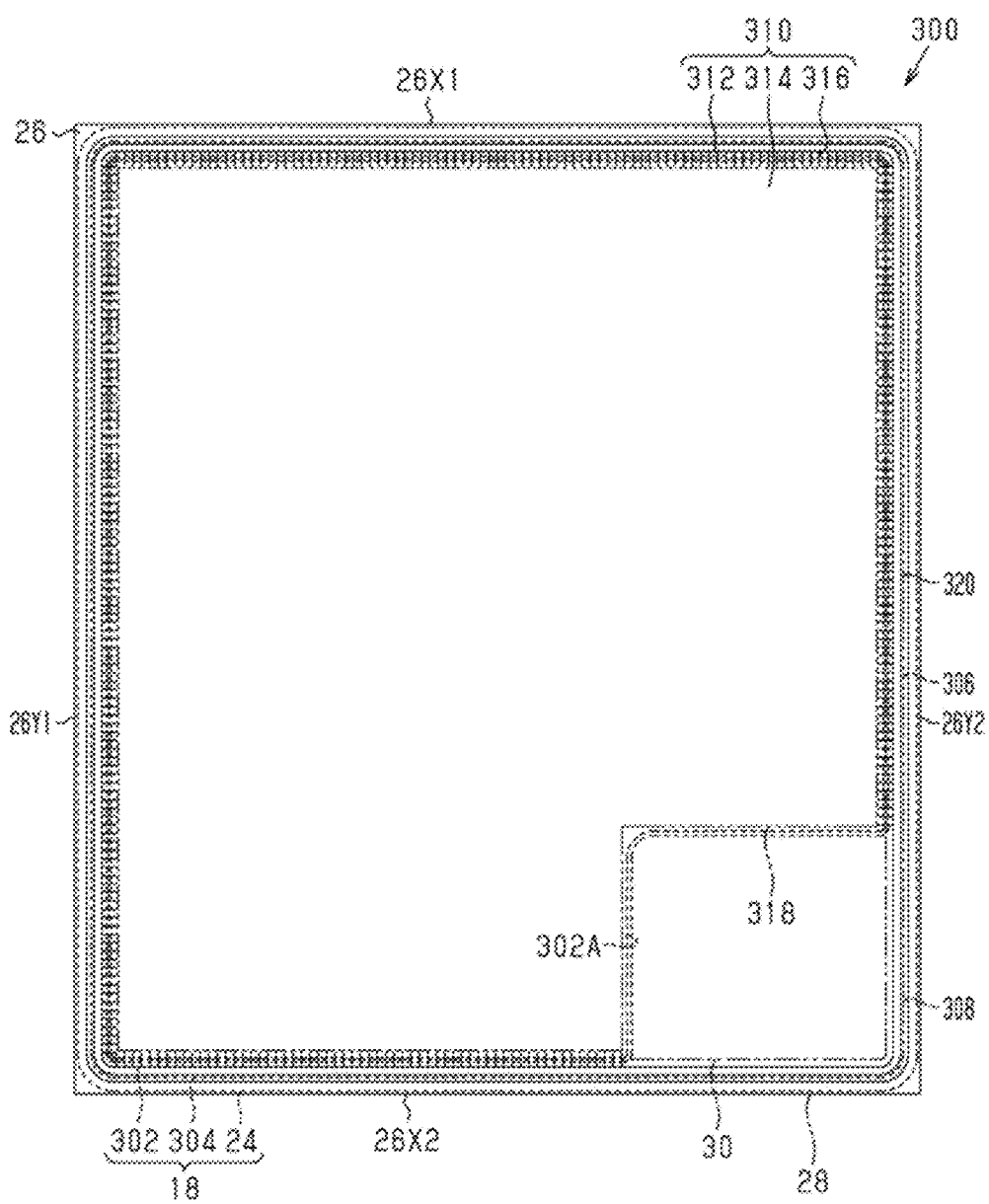
FIG. 15 is a schematic plan view of a semiconductor device according to a modification.

The position and dimensions of the gate pad portion 34 can be changed arbitrarily. FIG. 15 is a schematic cross-sectional view of a semiconductor device 300 according to a modification. In FIG. 15, the same components as in the semiconductor device 10 (in particular, see FIG. 3) are denoted by the same reference numerals. Further, detailed explanation of the same components as in the semiconductor device 10 will be omitted.

The semiconductor device 300 shown in FIG. 15 may include a source wiring 302 and a gate wiring 304. The source wiring 302 may include a recess 302A by having a notch which is substantially rectangular in a plan view. The recess 302A may be formed in a region near a point where the side 26X2 and the side 26Y2 of the semiconductor layer intersect each other.

The gate wiring 304 may include a gate finger portion 306 and a gate pad portion 308. The gate finger portion 306 is arranged in the outer peripheral region 28. The gate finger portion 306 may extend along portions of the outer edges 26X1, 26X2, 26Y1, and 26Y2 of the semiconductor layer 26 and partially surround the source wiring 302. The gate pad portion 308 may be arranged over both the outer peripheral region 28 and the inner region 30. The gate pad portion 308 may be integrally connected to the gate finger portion 306. The gate pad portion 308 is at least partially arranged within the recess 302A of the source wiring 302. The gate pad portion 308 may be arranged to connect between a portion of the gate finger portion 306 extending along the side 26X2 and a portion thereof extending along the side 26Y2.

The semiconductor device 300 may further include a gate trench 310 formed in the semiconductor layer 26. The gate trench 310 is formed in both the outer peripheral region 28 and the inner region 30 of the semiconductor layer 26. The gate trench 310 may include an outer peripheral gate trench portion 312 arranged in the outer peripheral region 28, an inner gate trench portion 314 arranged in the inner region 30, and a connection gate trench portion 316 which communicates the outer peripheral gate trench portion 312 with the inner gate trench portion 314.

The inner region 30 of the semiconductor layer 26 includes an active region 318. The active region 318 overlaps the source wiring 302 in a plan view. The active region 318 may have a shape similar to the source wiring 302 including the recess 302A in a plan view. The active region 318 may be one size smaller than the source wiring 302 including the recess 302A in a plan view. The active region 318 is covered with the source wiring 302, but is not covered with the gate pad portion 308. The inner gate trench portion 314 may be arranged in the active region 318.

The outer peripheral gate trench portion 312 is formed in a closed annular shape along the outer edges 26X1, 26X2, 26Y1, and 26Y2 of the semiconductor layer 26 in the outer peripheral region 28. That is, the outer peripheral gate trench portion 312 extends along the four sides 26X1, 26X2, 26Y1, and 26Y2 of the semiconductor layer 26. The outer peripheral gate trench portion 312 may have the same number of corners as the outer edges 26X1, 26X2, 26Y1, and 26Y2 of the semiconductor layer 26 in a plan view. In the illustrated example, since the outer edges 26X1, 26X2, 26Y1, and 26Y2 of the semiconductor layer 26 have four corners in a plan view, the outer peripheral gate trench portion 312 has four corners in the outer peripheral region 28.

The outer peripheral gate trench portion 312 may be arranged so as to surround the inner region 30. The outer peripheral gate trench portion 312 does not enter the inner region 30. The outer peripheral gate trench portion 312 overlaps both the gate finger portion 306 and the gate pad portion 308 in a plan view.

On the other hand, the connection gate trench portion 316 overlaps the gate finger portion 306 in a plan view, but does not overlap the gate pad portion 308. The outer peripheral gate trench portion 312 extends along the outer edges 26X1, 26X2, 26Y1, and 26Y2 of the semiconductor layer 26 rather than along the outer periphery of the active region 318.

Therefore, the outer peripheral gate trench portion 312 located below the gate pad portion 308 is spaced apart from the active region 318 in the X and Y directions by the dimension of the gate pad portion 308. The outer peripheral gate trench portion 312 overlapping the gate pad portion 308 in a plan view is not directly connected to the inner gate trench portion 314 of the active region 318 by the connection gate trench portion 316.

The semiconductor device 300 may further include a protection trench 320 formed in the semiconductor layer 26. The protection trench 320 is formed in a closed annular shape along the outer edges 26X1, 26X2, 26Y1, and 26Y2 of the semiconductor layer 26 in the outer peripheral region 28. That is, the protection trench 320 extends along the four sides 26X1, 26X2, 26Y1, and 26Y2 of the semiconductor layer 26. The protection trench 320 may have the same number of corners as the outer edges 26X1, 26X2, 26Y1, and 26Y2 of the semiconductor layer 26 in a plan view. In the illustrated example, since the outer edges 26X1, 26X2, 26Y1, and 26Y2 of the semiconductor layer 26 have four corners in a plan view, the protection trench 320 has four corners in the outer peripheral region 28.

The protection trench 320 may be arranged so as to surround the outer peripheral gate trench portion 312. Therefore, the protection trench 320 does not enter the inner region 30. The outer peripheral gate trench portion 312 is surrounded by the protection trench 320 in a plan view. The semiconductor device 300 may include a plurality of protection trenches 320.

In this way, the semiconductor device 300 is different from the semiconductor device 10 in that the gate pad portion 308 is arranged close to the corner where the sides 26X2 and 26Y2 of the semiconductor layer 26 intersect each other. On the other hand, similar to the semiconductor device 10, in the semiconductor device 300, the outer peripheral gate trench portion 312 and the protection trench 320 are formed in a closed annular shape along the outer edges 26X1, 26X2, 26Y1, and 26Y2 of the semiconductor layer 26 in the outer peripheral region 28. That is, the outer peripheral gate trench portion 312 and the protection trench 320 have no corners in the inner region 30. According to this configuration, electric field concentration in a region surrounded by the outer peripheral gate trench portion 312 and the protection trench 320 can be relaxed. As a result, in the semiconductor device 300 as well, it is possible to suppress an increase in the drain-source leakage current $I_{DSS}$.

In the above embodiment, a structure in which the conductivity type of each region in the semiconductor layer 26 is reversed may be adopted. That is, the p-type region may be an n-type region, and the n-type region may be a p-type region.

One or more of the various examples described herein can be combined as long as they are not technically inconsistent. In the present disclosure, "at least one of A and B" should be understood as meaning "only A, only B, or both A and B."

The term "on" as used in the present disclosure includes the meanings of "on" and "above" unless clearly stated otherwise in the context. Therefore, the expression "a first layer is formed on a second layer" is intended to mean that in some embodiments, the first layer can be directly arranged on the second layer in contact with the second layer, but in other embodiments, the first layer can be arranged above the second layer without contacting the second layer. That is, the term "on" does not exclude a structure in which other layers are formed between the first and second layers.

The terms indicating directions such as "vertical," "horizontal," "upward," "downward," "upper," "lower," "forward," "backward," "lateral," "left," "right," "front," "back," etc., as used in the present disclosure, depend on the particular orientation of a described and illustrated device. A variety of alternative orientations can be envisioned in the present disclosure, and thus these directional terms should not be interpreted narrowly.

For example, the Z direction used in the present disclosure does not necessarily have to be the vertical direction, and it does not have to be exactly the same as the vertical direction. Therefore, various structures according to the present disclosure are not limited to the Z direction "upper" and "lower" described herein being the vertical direction "upper" and "lower." For example, the X direction may be the vertical direction, or the Y direction may be the vertical direction.

SUPPLEMENTARY NOTES

The technical ideas that can be understood from the present disclosure are described below. In addition, for the purpose of aiding understanding and not for the purpose of limitation, components described in Supplementary Notes are labeled with the reference numerals of the corresponding components in the embodiments. The reference numerals are provided as examples to aid understanding, and the components described in Supplementary Notes should not be limited to the components indicated by the reference numerals.

Supplementary Note 1

A semiconductor device including:
a semiconductor layer (26);
a gate trench (36) formed in the semiconductor layer (26);
an insulating layer (60) formed on the semiconductor layer (26);
a gate electrode (62) buried in the gate trench (36) via the insulating layer (60);
a gate wiring (22) formed on the insulating layer (60) and electrically connected to the gate electrode (62); and
a protection trench (46) formed in the semiconductor layer (26),
wherein the semiconductor layer (26) includes an outer peripheral region (28) including outer edges (26X1, 26X2, 26Y1, 26Y2) of the semiconductor layer (26) in a plan view, and an inner region (30) surrounded by the outer peripheral region (28), and
wherein the gate trench (36) includes an outer peripheral gate trench portion (38) arranged in the outer peripheral region (28) and surrounded by the protection trench (46) in a plan view, and the outer peripheral gate trench portion (38) and the protection trench (46) are formed in a closed annular shape along the outer edges (26X1, 26X2, 26Y1, 26Y2) of the semiconductor layer (26) in the outer peripheral region (28).

Supplementary Note 2

The semiconductor device of Supplementary Note 1, further including: a protection electrode (76) buried in the protection trench (46) via the insulating layer (60), wherein the protection electrode (76) is formed in a closed annular shape in a plan view.

Supplementary Note 3

The semiconductor device of Supplementary Note 1 or 2, wherein the gate trench (36) includes:
an inner gate trench portion (40) arranged in the inner region (30); and
a connection gate trench portion (42) which communicates the outer peripheral gate trench portion (38) with the inner gate trench portion (40).

Supplementary Note 4

The semiconductor device of Supplementary Note 3, wherein the gate wiring (22) includes:
a gate finger portion (32) arranged in the outer peripheral region (28); and
a gate pad portion (34) arranged over the inner region (30) and the outer peripheral region (28).

Supplementary Note 5

The semiconductor device of Supplementary Note 4, wherein the connection gate trench portion (42) overlaps the gate finger portion (32) without overlapping the gate pad portion (34) in a plan view.

Supplementary Note 6

The semiconductor device of Supplementary Note 4 or 5, wherein a width of the outer peripheral gate trench portion (38) is larger than a width of the inner gate trench portion (40).

Supplementary Note 7

The semiconductor device of any one of Supplementary Notes 4 to 6, further including: a gate contact portion (50) extending through the insulating layer (60) and connecting the gate finger portion (32) and the gate electrode (62).

Supplementary Note 8

The semiconductor device of any one of Supplementary Notes 3 to 7, wherein the semiconductor layer (26) includes a drift region (68) of a first conductivity type, a body region (70) of a second conductivity type formed on the drift region (68), and a source region (72) of the first conductivity type formed in the body region (70), and
wherein the inner gate trench portion (40) reaches the drift region (68) through the source region (72) and the body region (70).

Supplementary Note 9

The semiconductor device of any one of Supplementary Notes 1 to 8, further including: a source wiring (20) formed on the insulating layer (60) and spaced apart from the gate wiring (22); and
a source contact portion (48) extending through the insulating layer (60) and connecting the source wiring (20) and the semiconductor layer (26),
wherein the source wiring (20) is surrounded by the gate wiring (22).

Supplementary Note 10

The semiconductor device of any one of Supplementary Notes 1 to 9, further including: an outer peripheral electrode (24) formed on the insulating layer (60) and spaced apart from the gate wiring (22), wherein the outer peripheral electrode (24) surrounds the gate wiring (22).

The above description is merely an example. Those skilled in the art will appreciate that more possible combinations and substitutions are possible beyond the components and methods (manufacturing processes) listed for the purposes of illustrating the techniques of the present disclosure. The present disclosure is intended to cover all alternatives, modifications, and changes that fall within the scope of the present disclosure, including the claims.

According to the present disclosure in some embodiments, it is possible to suppress an increase in drain-source leakage current.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor device comprising:
a semiconductor layer;
a gate trench formed in the semiconductor layer;
an insulating layer formed on the semiconductor layer;
a gate electrode buried in the gate trench via the insulating layer;
a gate wiring formed on the insulating layer and electrically connected to the gate electrode; and
a protection trench formed in the semiconductor layer,
wherein the semiconductor layer includes an outer peripheral region including outer edges of the semiconductor layer in a plan view and an inner region surrounded by the outer peripheral region,
wherein the gate trench includes an outer peripheral gate trench portion arranged in the outer peripheral region and surrounded by the protection trench in a plan view,
wherein the outer peripheral gate trench portion and the protection trench are formed in a closed annular shape along the outer edges of the semiconductor layer in the outer peripheral region,
wherein the gate trench includes:
an inner gate trench portion arranged in the inner region; and
a connection gate trench portion which communicates the outer peripheral gate trench portion with the inner gate trench portion, and
wherein the gate wiring includes:
a gate finger portion arranged in the outer peripheral region; and
a gate pad portion arranged over the inner region and the outer peripheral region.

2. The semiconductor device of claim 1, further comprising: a protection electrode buried in the protection trench via the insulating layer, wherein the protection electrode is formed in a closed annular shape in a plan view.

3. The semiconductor device of claim 1, wherein the connection gate trench portion overlaps the gate finger portion without overlapping the gate pad portion in a plan view.

4. The semiconductor device of claim 1, wherein a width of the outer peripheral gate trench portion is larger than a width of the inner gate trench portion.

5. The semiconductor device of claim 1, further comprising: a gate contact portion extending through the insulating layer and connecting the gate finger portion and the gate electrode.

6. The semiconductor device of claim 1, wherein the semiconductor layer includes a drift region of a first conductivity type, a body region of a second conductivity type formed on the drift region, and a source region of the first conductivity type formed in the body region, and
wherein the inner gate trench portion reaches the drift region through the source region and the body region.

7. The semiconductor device of claim 1, further comprising: an outer peripheral electrode formed on the insulating layer and spaced apart from the gate wiring, wherein the outer peripheral electrode surrounds the gate wiring.

8. A semiconductor device comprising:
a semiconductor layer;
a gate trench formed in the semiconductor layer;
an insulating layer formed on the semiconductor layer;
a gate electrode buried in the gate trench via the insulating layer;
a gate wiring formed on the insulating layer and electrically connected to the gate electrode;
a protection trench formed in the semiconductor layer;
a source wiring formed on the insulating layer and spaced apart from the gate wiring; and
a source contact portion extending through the insulating layer and connecting the source wiring and the semiconductor layer,
wherein the semiconductor layer includes an outer peripheral region including outer edges of the semiconductor layer in a plan view and an inner region surrounded by the outer peripheral region,
wherein the gate trench includes an outer peripheral gate trench portion arranged in the outer peripheral region and surrounded by the protection trench in a plan view,
wherein the outer peripheral gate trench portion and the protection trench are formed in a closed annular shape along the outer edges of the semiconductor layer in the outer peripheral region, and
wherein the source wiring is surrounded by the gate wiring.

9. The semiconductor device of claim 8, further comprising: a protection electrode buried in the protection trench via the insulating layer, wherein the protection electrode is formed in a closed annular shape in a plan view.

10. The semiconductor device of claim 8, wherein the gate trench includes:
an inner gate trench portion arranged in the inner region; and
a connection gate trench portion which communicates the outer peripheral gate trench portion with the inner gate trench portion.

11. The semiconductor device of claim 10, wherein the gate wiring includes:
a gate finger portion arranged in the outer peripheral region; and
a gate pad portion arranged over the inner region and the outer peripheral region.

12. The semiconductor device of claim 11, wherein the connection gate trench portion overlaps the gate finger portion without overlapping the gate pad portion in a plan view.

13. The semiconductor device of claim 11, wherein a width of the outer peripheral gate trench portion is larger than a width of the inner gate trench portion.

14. The semiconductor device of claim 11, further comprising: a gate contact portion extending through the insulating layer and connecting the gate finger portion and the gate electrode.

15. The semiconductor device of claim 10, wherein the semiconductor layer includes a drift region of a first conductivity type, a body region of a second conductivity type formed on the drift region, and a source region of the first conductivity type formed in the body region, and
wherein the inner gate trench portion reaches the drift region through the source region and the body region.

16. The semiconductor device of claim 8, further comprising: an outer peripheral electrode formed on the insulating layer and spaced apart from the gate wiring, wherein the outer peripheral electrode surrounds the gate wiring.

* * * * *